United States Patent
Balucani

(10) Patent No.: US 8,268,640 B2
(45) Date of Patent: Sep. 18, 2012

(54) METHOD FOR MAKING MICROSTRUCTURES BY CONVERTING POROUS SILICON INTO POROUS METAL OR CERAMICS

(75) Inventor: Marco Balucani, Rome (IT)

(73) Assignee: Rise Technology S.R.L., Pomezia (IT)

( * ) Notice: Subject to any disclaimer, the term of this patent is extended or adjusted under 35 U.S.C. 154(b) by 0 days.

(21) Appl. No.: 12/933,532

(22) PCT Filed: Mar. 18, 2009

(86) PCT No.: PCT/EP2009/053197
§ 371 (c)(1),
(2), (4) Date: Dec. 13, 2010

(87) PCT Pub. No.: WO2009/115551
PCT Pub. Date: Sep. 24, 2009

(65) Prior Publication Data
US 2011/0104828 A1    May 5, 2011

(30) Foreign Application Priority Data

Mar. 21, 2008 (EP) .................................. 08425186
Nov. 4, 2008 (IT) .............................. MI2008A1941

(51) Int. Cl.
*H01L 21/00* (2006.01)
*H01L 21/44* (2006.01)
*H01L 21/48* (2006.01)
*H01L 21/50* (2006.01)
*H01L 21/20* (2006.01)

(52) U.S. Cl. ............ 438/3; 438/106; 438/109; 438/122; 438/584; 438/667

(58) Field of Classification Search .............. 438/3, 106, 438/109, 122, 667, 584
See application file for complete search history.

(56) References Cited

U.S. PATENT DOCUMENTS
2002/0138049 A1* 9/2002 Allen et al. .................. 604/272
(Continued)

FOREIGN PATENT DOCUMENTS
EP            0499488 A      8/1992
(Continued)

OTHER PUBLICATIONS

International Search Report for International Patent Application No. PCT/EP2009/053197, dated Aug. 19, 2009.
(Continued)

*Primary Examiner* — William M. Brewster
(74) *Attorney, Agent, or Firm* — Graybeal Jackson LLP; Kevin D. Jablonski

(57) ABSTRACT

A method for making a micro structure (100) is proposed. The method starts with the step of providing a silicon substrate (102), which has a main surface. A porous silicon layer (103)—extending into the silicon substrate from the main surface—is then formed. The method continues by etching the porous silicon layer selectively to obtain a set of projecting microelements of porous silicon (112); each projecting microelement projects from a remaining portion of the silicon substrate (106), thereby exposing a corresponding external surface. The projecting microelements are then treated to obtain a set of corresponding conductive (115) or insulating (115') microelements; each conductive or insulating microelement is obtained by converting at least a prevalent portion of the porous silicon (extending into the corresponding projecting element from the external surface) into porous metal or ceramics, respectively.

10 Claims, 22 Drawing Sheets

U.S. PATENT DOCUMENTS

2006/0234079 A1    10/2006   Zhang et al.
2007/0116882 A1*   5/2007    Chan et al. ................. 427/430.1

FOREIGN PATENT DOCUMENTS

EP            0797258 A     9/1997

OTHER PUBLICATIONS

Jose G.A. Brito-Nito, Kentaro Kondo, Masanori Hayase, Porous Gold Structures Templated by Porous Silicon, Journal of the Electromechanical Society, 2008, pp. D78-D82, vol. 155 (1).

H. Bandarenka, M. Balucani, R. Crescenzi, A. Ferrari, Formation of Composite Nanostructures by Corrosive Deposition of Copper Into Porous Silicon, Superlattices and Microstructures, 2008, pp. 583-587, vol. 44, Elsevier Ltd.

M. Hayase, Y. Saito, K. Kondo, J.G.A. Brito-Neto, Formation of Porous Ruthenium Layer on Porous Silicon Template, 212th ECS Meeting, Abstract #1365, 2006, p. 153, The Electrochemical Society.

F.A. Harraz, T. Sakka, Y.H. Ogata, Immersion Plating of Nickel Onto a Porous Silicon Layer From Fluoride Solutions, Phys. Stat. Sol. (a), 2003, pp. 51-56, vol. 197 No. 1, Wiley-VCH Verlag GmbH & Co KgaA, Weinheim.

Masanori Hayase, Takahiko Kawase, Takeshi Hatsuzawa, Miniature 250 μm Thick Fuel Cell with Monolithically Fabricated Silicon Electrodes, Electrochemical and Solid-State Letters, 2004, pp. A231-A234, vol. 7 No. 8, The Electrochemical Society, Inc.

Xi Zhang, King-Ning Tu, Preparation of Hierarchically Porous Nickel from Macroporous Silicon, J. Am. Chem. Soc., 2006, pp. 15036-15037, vol. 128, American Chemical Society.

* cited by examiner

METHOD FOR MAKING MICROSTRUCTURES BY CONVERTING POROUS SILICON INTO POROUS METAL OR CERAMICS

PRIORITY CLAIM

The present application is a national phase application filed pursuant to 35 USC §371 of International Patent Application Serial No. PCT/EP2009/053197, filed Mar. 18, 2009; which application claims the benefit of European Patent Application Serial No. 08425186.7, filed Mar. 21, 2008; and further claims the benefit of Italian Patent Application Serial No. MI2008A001941, filed Nov. 4, 2008; all of the foregoing applications are incorporated herein by reference in their entireties.

TECHNICAL FIELD

The solution according to embodiments of the subject matter disclosed herein relates to microstructures.

BACKGROUND

The microstructures (either conductive or insulating) are commonly used in a myriad of applications. A typical example is a circuitized substrate for packaging a chip of semiconductor material (wherein an integrated circuit is formed); generally, the substrate is made of an insulating base for supporting conductive connection elements. For instance, in an electronic device of the Ball Grid Array (BGA) type, the chip is mounted on an upper surface of the substrate. Terminals of the chip are then bonded to corresponding contacts (such as pads), which are provided on the same upper surface of the substrate (such as with a flip-chip technique). Through via-holes (or simply vias) cross the substrate, so as to connect the pads on its upper surface with corresponding conductive balls provided on a lower surface of the substrate. The structure so obtained is then enclosed within a protective cover (for example, of plastic material), which only leaves exposed the balls on the lower surface of the substrate (implementing external terminals of the electronic device).

In this context, a problem is due to the demand of higher and higher density of the contacts for the terminals of the chips; indeed, the growing complexity of the integrated circuits requires a huge number of terminals in the chips (especially for multiprocessor components), with a corresponding decrease of their pitch. However, even very sophisticated production processes—such as the ones based on the micro-via technology, also known as Sequential Build-Up (SBU) or High Density Interconnect (HDI)—do not allow obtaining vias with a diameter smaller than 50-80 μm.

The increasing terminal density of the chips also raises a big issue for the dissipation of heat that is produced by the chips; this may be very critical, especially at specific areas (hot-spots) where the heating of the chips concentrates.

Another problem of the know substrates is the requirement of very low resistance of the connections between the terminals of the chips and the terminals of the electronic device through the corresponding vias. For example, in complex System on Chips (SOCs), such as for mobile telephones wherein almost all the functions thereof are implemented in a few chips, the resistance of each connection should not exceed 70-80 mΩ.

On the other hand, in some applications (for example, when the electronic devices work at high frequencies) a low dielectric constant of the insulating base of the substrate is required, in order to reduce the coupling stray capacitance of the connections. Moreover, in power applications it is also required that the insulating base should exhibit a high breakdown voltage.

A further problem concerns the reliability of the electronic devices. Indeed, any difference between the Thermal Coefficient of Expansion (TCE) of the chips and of the substrates may cause mechanical stresses on the chips (especially at their bonding with the substrates in the flip-chip technique). The problem is further exacerbated by the use of ultra-low-k dielectric materials, which demand that the substrates should virtually cause no stress on the chips.

Similar considerations apply to Package-On-Package (POP) structures, wherein two or more electronic devices (each one with the corresponding substrate) are mounted one above the other.

Another example of application of the microstructures is in Micro-ElectroMechanical Systems (MEMS). In this case, it is required the capability of making (conductive or insulating) microstructures of complex shape; desired characteristics of these microstructures may be high mechanical stiffness, low weight and/or resistance to extreme temperatures (for example, down to −100° C. or up to +1,500° C.).

Moreover, the microstructures may also be used in precision micro-mechanical applications (for example, in watches). This may require (conductive or insulating) microstructures very stable with respect to the temperature, with low inertia and/or suitable to be used in harsh environments (for example, being corrosion-resistant).

Equivalent, additional and/or different problems are also experienced in other technical fields that require the use of microstructures. For example, this is the case of magneto-dielectric materials (such as for use in electromagnetic antennas), vacuum electronic devices (such as microware tubes, or better in the TeraHz frequency region considering the dimensions of the microstructures), and so on.

SUMMARY

In its general terms, the solution according to various embodiments of the subject matter disclosed herein is based on the idea of making the microstructures from porous silicon.

Particularly, different aspects of the embodiments provide a solution as set out in the independent claims. Advantageous embodiments are set out in the dependent claims.

More specifically, an aspect of the solution according to an embodiment proposes a method for making a microstructure. The method starts with the step of providing a silicon substrate (having a main surface). A porous silicon layer—extending into the silicon substrate from the main surface—is then formed. The method continues by etching the porous silicon layer selectively to obtain a set of projecting microelements of porous silicon; each projecting microelement projects from a remaining portion of the silicon substrate, thereby exposing a corresponding external surface. The projecting microelements are then treated to obtain a set of corresponding conductive or insulating microelements; each conductive or insulating microelement is obtained by converting at least a prevalent portion of the porous silicon (extending into the corresponding projecting microelement from the external surface) into porous metal or ceramics, respectively.

Other aspects of the solution according to specific embodiments propose methods for making a magneto-dielectric structure, an interconnection structure, a packaged electronic device, a package-to-package electronic device, a power electronic device, a vacuum electronic device, and a micromechanism.

BRIEF DESCRIPTION OF THE FIGURES

The solution according to embodiments, as well as further features and the advantages thereof, will be best understood with reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein. Particularly.

DETAILED DESCRIPTION

With reference in particular to FIGS. 1A-1D', there are show the various phases of a production process for making a conductive or insulating microstructure (denoted in FIG. 1D with the reference 100 and in FIG. 1D' with the reference 100', respectively) according to an embodiment.

Figure 1A:
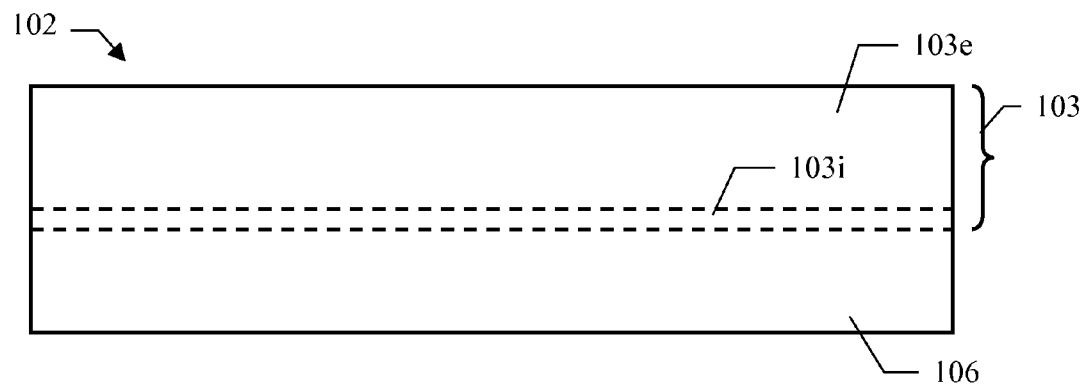
FIGS. 1A-1D' show the various phases of a production process for making a microstructure according to an embodiment.

As shown in FIG. 1A, the production process starts with a silicon substrate 102 (for example, consisting of a wafer of mono-crystalline silicon); a single microstructure may be formed on the full wafer, or the same microstructure may be repeated in several identical areas of the wafer that are then diced at the end of the process. A porous silicon layer 103 is formed in the silicon substrate 102; the porous silicon layer 103 extends from a front (upper) surface of the silicon substrate 102, so as to leave a remaining portion thereof of non-porous, or compact, silicon (denoted with the reference 106).

For this purpose, the silicon substrate 102 is subjected to an anodic process (acting on its front surface). Particularly, the silicon substrate 102 is used as an anode in an electrochemical cell (including an electrolyte being rich of Hydrofluoric acid, or HF). When a current density of the anodic process is lower than a critical value $J_{PS}$ (depending on multiple experimental factors), the electrolyte only reacts with holes that reach the front surface of the silicon substrate 102 (so that the reaction is limited by the feeding of the holes and not by their ionic diffusion into the electrolyte). Of course, this requires the availability of (free) holes at the front surface of the silicon substrate 102. The availability of holes is obvious if the silicon substrate 102 is of the P-type. Conversely, if the silicon substrate 102 is of the N-type the interface silicon-electrolyte acts as a reverse-biased Schottkly junction (i.e., with a depletion region whose width decreases as the concentration of impurities in the silicon substrate 102 increases). When the silicon substrate 102 has a high concentration of impurities (N+), the free holes in the silicon substrate 102 can pass through the potential barrier of this junction by quantum-mechanical tunneling; conversely, it is necessary to provide energy to the holes for allowing their passage through the potential barrier—for example, by lighting the silicon substrate 102 on its front surface and/or on a back (lower) surface thereof.

The porous silicon (PS) is classified as nanoPS (or microPS), mesoPS and macroPS according to a diameter of its pores; particularly, the diameter of the pores is lower than 2 nm in the nanoPS, between 2 nm and 50 nm in the mesoPS, and higher than 50 nm in the macroPS. In principle, the nanoPS is formed in every silicon substrate independently of its doping; however, a pure nanoPS can be obtained only in silicon substrates of the P-type with a low concentration of impurities. A mixture of nanoPS and mesoPS is instead obtained in silicon substrates with a high concentration of impurities (either of the N-type or of the P-type). At the end, the macroPS can be obtained in silicon substrates with low concentration of impurities (with nanoPS that is found to cover the pores when the silicon substrate is of the N-type).

The characteristics of the porous silicon depend on its morphology, which in turn is a function of a regime of the anodic process being defined by different parameters (for example, the length, the concentration and the type of impurities of the silicon, the current density, the type of electrolyte, and the like). In this context, the relevant characteristic of the porous silicon is its porosity (Ps %), which is defined with respect to the (compact) silicon as:

$$P_{PS}\% = \left(1 - \frac{\rho_{PS}}{\rho_{Si}}\right)\%,$$

where $\rho_{PS}$ is the density of the porous silicon and $\rho_{Si}$ is the density of the compact silicon (i.e., 2.3 g/cm³). The density of the porous silicon $\rho_{PS}$ can be measured by applying the following formula:

$$\rho_{PS} = \rho_{Si} - \frac{P_{Si} - P_{PS}}{S_{PS} \cdot D_{PS}},$$

where the values $P_{Si}$ (initial weight of the silicon substrate before the anodic process), $P_{PS}$ (ending weight of the silicon substrate after the anodic process) and $D_{PS}$ (thickness of the porous silicon layer) can be measured, while the value $S_{PS}$ (extension of the front surface of the silicon substrate being subjected to the anodic process) is known.

Particularly, the porosity $P_{PS}$% increases as the electrolyte concentration decreases and/or as the current density increases. In some applications, it is preferable to maintain the porosity $P_{PS}$% the same in the whole porous silicon layer 103 (for example, to obtain uniform microstructures). For this purpose, if the thickness $D_{PS}$ of the porous silicon layer 103 is low (for example, up to 50 μm), it is enough to maintain the process parameters constant over time. However, when the thickness $D_{PS}$ of the porous silicon layer 103 is relatively high (for example, more than 50 μm), the electrolyte concentration in a lower portion of the porous silicon layer 103 decreases because of a limitation in its ionic diffusion. Nevertheless, it is still possible to obtain a uniform porosity by decreasing the current density over time accordingly (e.g., with a linear law). On the contrary, in other applications it is preferable to modulate the porosity $P_{PS}$ % throughout the porous silicon layer 103; for example, it may be preferable to have the porosity $P_{PS}$ % that increases inwards the porous silicon layer 103 (so as to avoid additional operations, such as a process for closing the pores). In view of the above, such result can be obtained by varying the process parameters accordingly (for example, by increasing the current density over time with a linear law), or even with constant process parameters when the thickness $D_{PS}$ of the porous silicon layer 103 is high (for example, more than 50 μm), For example, the following experimental results were obtained with a silicon substrate of the N+ type having a resistivity of 0.01-0.02 Ωcm, which silicon substrate was immersed into an electrolyte HF:$C_2H_5OH$=3:1; the anodic process was performed at room temperature, by applying the following regimes of the current density:

| Sample No. | Current Density | | Decreasing Law | Time [s] | Thickness [μm] | Porosity |
|---|---|---|---|---|---|---|
| | Start Value [mA/cm$^2$] | End Value [mA/cm$^2$] | | | | |
| 1 | 70 | 60 | Linear | 2400 | 145 | 36.80% |
| 2 | 40 | 20 | Constant | 600 | 100 | 25.20% |
| | 40 | — | Linear | 2000 | | |
| 3 | 100 | 40 | Linear | 3600 | 203 | 50.80% |
| 4 | 120 | 60 | Linear | 2880 | 200 | 64.80% |
| 5 | 120 | 30 | Linear | 5000 | 310 | 62.30% |
| 6 | 40 | — | Constant | 600 | 34.8 | 25.50% |
| 7 | 80 | — | Constant | 600 | 49.8 | 46.80% |

The regime of the anodic process can be changed without any problem in order to obtain the desired thickness $D_{PS}$ and porosity $P_{PS}$ % of the porous silicon layer 102. For example, the thickness $D_{PS}$ can range from 1 μm to 500 μm; the porosity $P_{PS}$ % can instead range from 10% (in case on macroPS) or from 20% (in case of nanoPS or mesoPS) to 85-95%.

In some applications—when the (remaining) silicon substrate 106 is to be removed, as described in the following—it is preferable to a have a (thicker) external portion of the porous silicon layer (denoted with 103e) with a uniform porosity $P_{PS}$ %, and a (thinner) internal portion thereof (denoted with 103i) with a higher porosity $P_{PS}$ % (for example, equal to 1.2-2.0 times the one of the external portion 103e). The internal portion 103i may be obtained by increasing the current density at the end of the anodization process. For example, by applying a pulse with a constant current density of 120 mA/cm$^2$ for 30s after the anodic process providing the sample No. 4 in the table above (thickness 200 μm and porosity $P_{PS}$ %=64.80% of the external portion 103e), it is possible to obtain an internal portion 103i with a thickness of 1.5-1.8 μm and a porosity $P_{PS}$ %=85%.

Figure 1B:
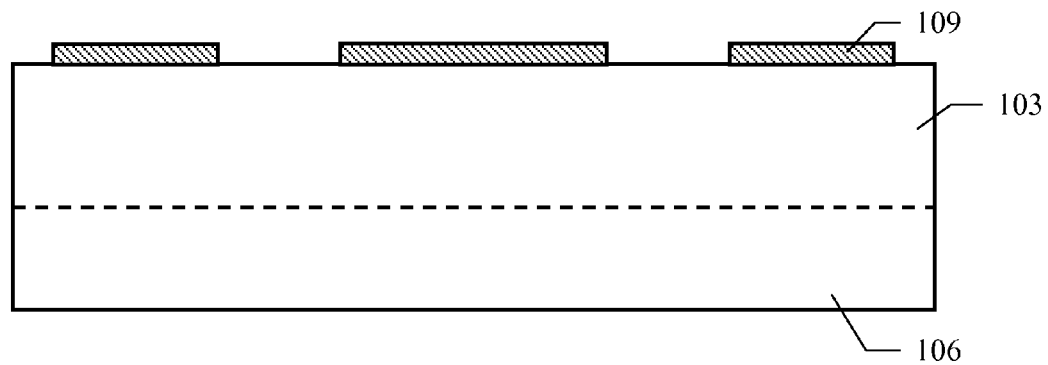

Continuing to FIG. 1B, an etching mask 109 is formed on the front surface of the porous silicon layer 103. The mask 109 consists of a thin layer of material (for example, with a thickness of 10-50 nm), which is adapted to protect the porous silicon layer 103 during a next etching process; for example, the mask 109 may be made of a metal like Ni, Au, Pt, Ti, Al and Cr—for a Reactive Ion Etching (RIE) process—and of a dielectric like $SiO_2$ or a photo-resist—for a Deep-RIE (DRIE) process based on the Bosch method. The mask 109 is patterned so as to leave exposed areas of the porous silicon layer 103 where (conductive or insulating) functional microelements of the final microstructure are desired. This result may be achieved with a photolithographic process. For this purpose, a masking layer is deposited on the porous silicon layer 103. A photo-resist layer is in turn deposited on the masking layer and shaped photo-lithographically so as to leave exposed the portions of the masking layer to be removed through an etching process. Alternatively, the same result may also be achieved with a lift-off process. In this case, a photo-resist layer is deposited on the porous silicon layer 103 and shaped photo-lithographically so as to be removed from the areas of the functional microelements. A masking layer is then deposited on the photo-resist layer and on the exposed areas of the porous silicon layer 103. The photo-resist layer is now removed, taking away the masking layer being formed on it; therefore, the masking layer remains on the areas of the functional microelements only. In this case, however, when a positive photo-resist material is used (requiring an alkaline solution for its development), it is necessary to protect the porous silicon layer 103 beforehand (so as to avoid any undesired etching thereof due to its porosity). For this purpose, it is possible to protect the porous silicon layer 103 with a thin layer (not shown in the figure) of $SiO_2$ or polysilicon—such as with a thickness lower than 0.5 μm (e.g., 100 nm)—which is deposited on the porous silicon layer 103 by means of a thin film process.

Figure 1C:
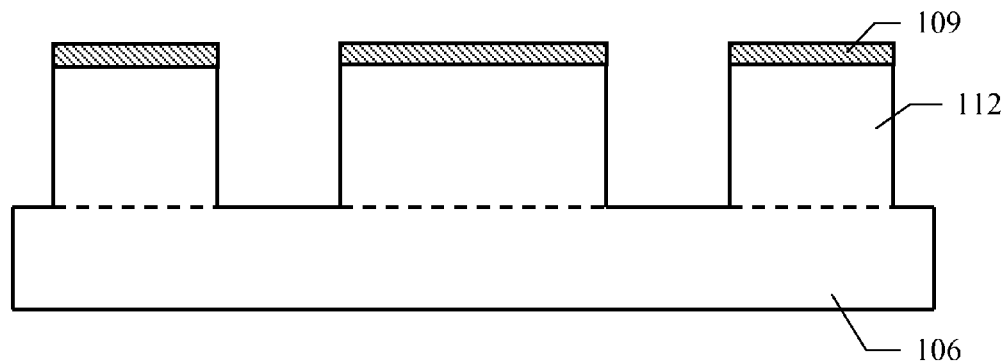

The process continues to FIG. 1C, wherein the porous silicon layer 103 is subjected to an etching process through the mask 109; the etching process is of the anisotropic type—i.e., with a very low ratio between its lateral etching rate and vertical etching rate—in order to obtain the functional microelements with the desired shape as defined by the mask 109. For this purpose, it is possible to use a plasma etching process of the RIE type with a suitable gas (e.g., high concentration of $CHF_3$ with respect to $SF_6$), high Radio-Frequency (RF) power, and/or low pressure. For example, an RIE process with an RF power of 250 W and a pressure of 20 mTorr provides a lateral/vertical ratio equal to 1:10 or 1:65 with a gas $SF_6$ or $CHF_3$:$SF_6$=17:3, respectively. Lower lateral/vertical ratios (down to 1:500) can instead be obtained with a plasma etching process of the DRIE type based on the Bosch method. At the same time, the vertical etching rate (increasing with the porosity $P_{PS}$ % for values thereof up to 55%) should be kept relatively low, so as to allow controlling the extent of the etching (down to the silicon substrate 106) with the desired level of accuracy. Typically, suitable values of the vertical etching rate are 1-7 μm/min. When very strict accuracy requirements apply, it is instead necessary to use far lower vertical etching rates (down to 100 nm/min); for example, this result may be achieved in a DRIE process by simply decreasing the RF power (since the lateral/vertical ratio remains in any case low), or in a RIE process by changing the gas (such as increasing the $CHF_3$ concentration or using $NF_3$, $CF_4$ with a mixture of $O_2$) to maintain an acceptable lateral/vertical ratio.

The etching process generates projecting microelements 112 (of porous silicon) corresponding to the desired functional microelements; particularly, each projecting microelement 112 projects upwardly from the silicon substrate 106, so as to expose a corresponding external surface (laterally, and at the top below the mask 109). The mask 109 is then removed (for example, with a wet etching process).

Figure 1D:
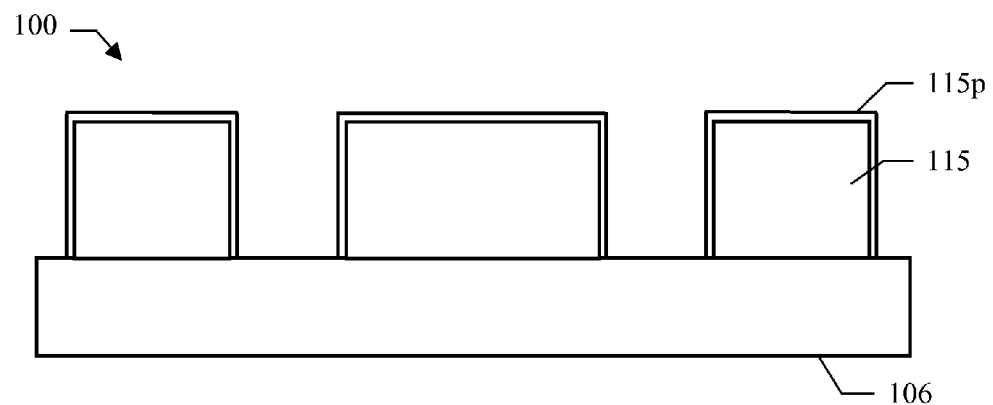
Figure 1D:
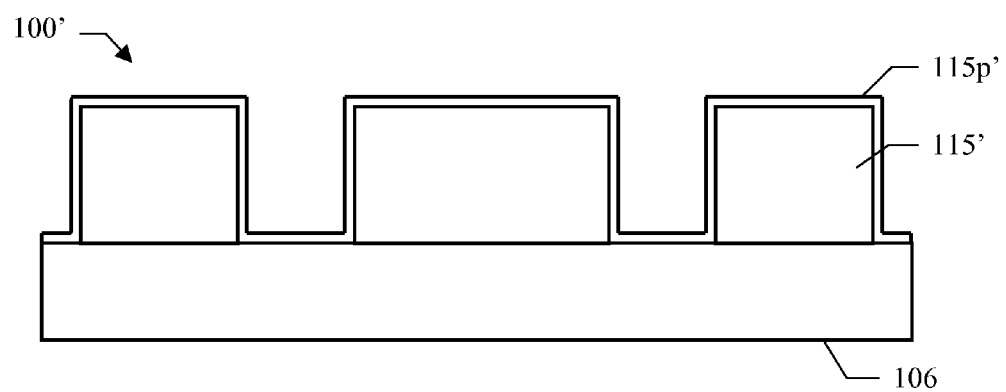

Moving to FIG. 1D, the projecting microelements (112 in FIG. 1C) are then treated so as to obtain corresponding conductive (functional) microelements 115; particularly, the porous silicon extending into the projecting microelements (from their external surfaces) is converted into porous metal; examples of such porous metal are Cu, Ni, Au, Pt, Ru, Ag, and so on. For this purpose, the structure is immersed into a suitable solution; the type of solution determines the porous metal that is obtained and its morphology (which may be either the same as or different from the morphology of the porous silicon), while the length of the process determines the extent of the conversion (which may involve the whole projecting microelements or only a portion thereof). For example, a solution of $0.025M\ CuSO_4.5H_2O+0.01M\ HF$ was used to convert projecting microelements (with a height of 200 µm, a width of 50 µm and a porosity $P_{PS}\%=50\%$) completely into corresponding conductive microelements 115 of porous copper (with a porosity $P_{PM}\%=64.80\%$) in 30 min; the same process was used to convert only a portion of the projecting microelements with a thickness of 25 µm or 10 µm in 25 min or 7 min, respectively. Similar processes (also known as displacement or corrosive depositions) have already been reported by researchers in completely different applications—that is, only for converting porous silicon layers of the uniform type into porous metal films of the continuous type to be used as catalysts in full-cells or batteries— for example, as described in Xi Zhang, King-Ning Tu, "Preparation of hierarchically porous nickel from macroporous silicon" J. Am. Chem. Soc. 2006, 128, 15036-15037, in M. Hayase et al. "Formation of porous ruthenium layer on porous silicon template" Electrochem. Soc. 2006, 153, C741, in H. Bandarenka, M. Balucani, R. Crescenzi, A. Ferrari, "Formation of composite nanostructures by corrosive deposition of copper into porous silicon" Superlattices and Microstructures, In Press, Corrected Proof, Available online 24 Jan. 2008, in M. Hayase et al. "Miniature 250 µm thick full cell with monolithically fabricated silicon electrodes", Electrochemical and Solid State Letters, 7 (8) A231-A234 (2004), in F. A. Harraz et al. "Immersion plating of nickel onto a porous silicon layer from fluoride solutions" Phys. Stat. Sol. (a), 2003, 197, 51-56, or in J. G. A. Brito-Neto et al. "Porous gold structures built on silicon substrates" 211th ECS Meeting Abstracts, N° 877 (2007), the entire disclosures of which are herein incorporated by reference.

Optionally, the conductive elements 115 may also be covered with a (compact) metal layer 115p (either of the same type as or of a different type of the porous metal of the conductive microelements 115). For example, this result may be achieved with an (electrolytic or electro-less) plating process. In this way, it is possible to reduce the resistance of the conductive microelements 115 and/or to increase their mechanical stability (without substantially affecting the shape thereof). As a result, there is obtained the desired conductive microstructure 100 that may be used in a myriad of applications (as described in detail in the following).

Alternatively, as shown in FIG. 1D', the projecting microelements (112 in FIG. 1C) are instead treated so as to obtain corresponding (functional) insulating microelements 115'; particularly, the porous silicon extending into the projecting microelements (from their external surfaces) is converted into porous or compact ceramics. Examples of these ceramics are $SiO_2$, $SiO_x$, SiON, SiOCN, SiC, SiOC, and so on. For this purpose, the structure is subjected to a suitable thermal process; the atmosphere (gas or vapor) of the thermal process determines the ceramics that are obtained, the regime of the thermal process determines the morphology of the ceramics if it is porous (which may be either the same as or different from the morphology of the porous silicon), while the length of the thermal process determines the extent of the conversion (which may involve the whole projecting microelements or only a portion thereof). For example, a structure with projecting microelements of nanoPS or microPS (with a height of 100 µm, and a porosity $P_{PS}\%=50\text{-}65\%$ and preferably $P_{PS}\%=55\text{-}60\%$) has been inserted into an oven, and pre-heated to 300° C. for 1 hour in inert atmosphere (for example, nitrogen). The temperature of the oven is then raised from 300° C. to 900° C. in 1 hour. At this point, oxygen is supplied to the oven with a flow of 1-10 l/minute (for example, 5 l/minute) maintaining the temperature at 900° C. for 30 minutes; the temperature is then raised to 1000-1,100° C. in 30 minutes. This temperature is maintained for a period of time necessary to oxidize the desired thickness of the projecting microelements; the values of the oxidation time as a function of the temperature are known in literature for the different types of porous silicon (for example, of the order of 1 hour for the porous silicon of the nanoPS type and 10-12 hours for the porous silicon of the macroPS type). If it is desired to obtain microelements of compact ceramics, the structure is further subjected to a densification process (to convert the porous ceramics into compact ceramics). For this purpose, the temperature is raised up to 1,200-1,300° C. in 1 hour, and maintained to such temperature for at least 1 hour. In any case, the structure is now cooled slowly (in order not to cause mechanical stresses thereon)—for example, by switching off the oven and leaving the structure inside it. A similar thermal process is applied to carbonize or oxygen-carbonize the projecting microelements; in this case, the used gases can be CO or $CO_2$ (for the carbonization) or nitrogen being made to bubble in solutions of ammonia (for the oxygen-carbonization), while the temperatures at stake are higher (of the order of 1,400-1,550° C.).

As a further improvement, before the thermal process the structure may be immersed into a solution containing nano-particles of several types (such as C, Ni, Ti, Al, and the like); these nano-particles will penetrate inside the projecting microelements (of porous silicon)—in an amount and to a depth depending on the type of porous silicon, the type of nano-particles and the immersion time. The solution is then made to evaporate, so that the nano-particles remain inside the projecting microelements. In this way, during the next thermal process these nano-particles will react with the used gas or vapor thereby forming ceramics begin composed of atoms of silicon, atoms of the elements making the gas or vapor, and atoms of the nano-particles. With this technique compound ceramics being unknown up to now can be obtained (for example, with improved mechanical strength and/or heat conductivity).

Another technique may be of treating the projecting microelements on their surface with a polymeric material (for example, Polymethylmethacrylate or PMMA), which is caused to penetrate into the projecting microelements to a desired depth. During the next thermal process (with oxygen), the polymeric material will be burnt thereby releasing atoms of carbon. In this way, it is possible to obtain insulating microelements 115' with a compound structure, having an outer layer of SiOC (even with non-interger stoichiometric values) and an inner layer of SiO.

Optionally, the insulating microelements 115' and a free surface of the silicon substrate 106 may also be covered with a metal layer 115p' (for example, with a thin film or thick film process). Such layer of metal 115p' allows performing electro-plating processes later on (not shown in figure). As a result, there is obtained the desired insulating microstructure 100' that may be used in a myriad of applications (as described in detail in the following).

The proposed solution is very flexible, since it allows obtaining (conductive or insulating) functional microelements with a wide range of (electrical and/or mechanical) characteristics. Particularly, the functional microelements may have any kind of shape; for example, the functional microelements may be in the form of pillars—with a circular, squared, or any other section—in the form of walls—such as straight, broken, or curved, such as open or closed, and such as with a uniform or a variable width (either enlarging at the middle or at the ends)—or in the form of complex 3-dimensional (3D) structures. The shape of the functional microelements is only constrained by the technological limits of the above-described etching process that is exploited for their definition and by the desired mechanical stability (also depending on the porosity $P_{PM}$% of the porous metal or of the porous ceramics). Generally, functional microelements with an aspect ratio (between their height and width) up to 20-30 can be made with any shape and porosity $P_{PM}$ % without problems; for example, it is possible to make functional microelements in the form of pillars with a height of 200-300 μm and a width of 8-12 μm (of course, higher and/or thinner functional microelements are possible with other shapes). The porosity $P_{PM}$ % (of the porous metal or of the porous ceramics) and/or the extent of the conversion from porous silicon also allow controlling the weight and the stiffness of the functional microelements (with the higher the porosity $P_{PM}$ % and the lower the extent of the conversion, the lower the weight and the stiffness). The same parameters may also be used to control the resistance of the conductive microelements (which decreases with the porosity $P_{PM}$ % and the extent of the conversion). In this respect, a unique mathematical formula that expresses the electrical resistivity of the porous metal as a function of its porosity $P_{PM}$ % is still under investigation by the scientific community (since it depends on the type of porous metal that is obtained—i.e. foam metal, sintered powder metal, etc.). Any way, it was found that experimental data on porous copper substantially matches the following formula (proposed for the first time in the NASA topical report "Thermal conductivity and electrical resistivity of porous material" CRI-20854—October 1971):

$$\rho_{PM} = \rho_M \frac{1 + K \cdot (P_{PM} \ \%)^2}{1 - P_{PM} \ \%},$$

wherein $\rho_{PM}$ and $\rho_M$ are the electrical resistivity of the porous copper and of the compact copper, respectively, and K a fitting parameter obtained experimentally that is set equal to 11 (as in the NASA report for porous copper obtained by sintered powder).

Moving now to FIGS. 2A-2G, there are show the various phases of a production process for making a conductive or insulating microstructure (denoted in FIG. 2G with the reference 200) according to another embodiment (in the following, the elements corresponding to the ones shown in the preceding figures are denoted with similar references obtained by simply changing their first number, and the corresponding explanation is omitted for the sake of exposition brevity).

Figure 2A:
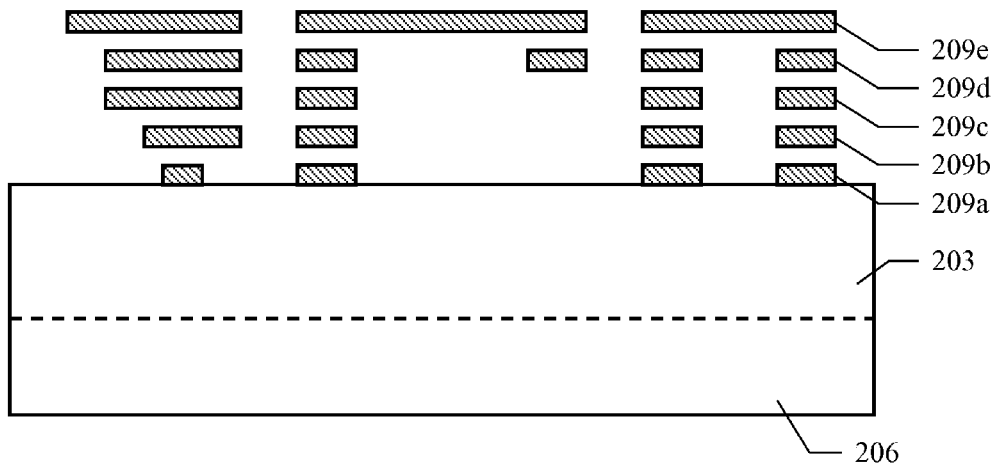
FIGS. 2A-2G show the various phases of a production process for making a microstructure according to another embodiment.

As shown in FIG. 2A, a porous silicon layer 203 is formed on a silicon substrate 206 as described above. A plurality of N etching masks (with N≧2) is then formed on the front surface of the porous silicon layer 203, in order to obtain corresponding 3-D (conductive or insulating) functional microelements with N−1 layers along their extension from the silicon substrate 206 (with each layer that has a different width transversally to the extension of the functional microelements); particularly, in the example at issue five masks 209a, 209b, 209c, 209d and 209e are illustrated. The masks 209a-209e are stacked one on the other, starting from the lowest mask 209a that is arranged directly on the porous silicon layer 203 (although the masks 209a-209e are separated in the figure for the sake of clarity, it should be understood that in reality they are directly in contact); it should be noted that the non-planarity of the masks 209a-209e is substantially negligible (since the masks 209a-209e are very thin—i.e., 10-100 nm), so that it does not create any problem during the corresponding photolithographic processes. The masks 209a-209e are made of different materials, which may be etched selectively one to the others (so as to allow their removal individually); for example, the masks 209a, 209b, 209c, 209d and 209e may be made of Pt, Au, Ti, Ni and Al, respectively. Each mask 209a-209e is patterned according to the desired shape of the corresponding layer of the functional microelements (with the resulting functional microelements that are defined on the whole by the complex of the masks being overturned vertically).

Figure 2B:
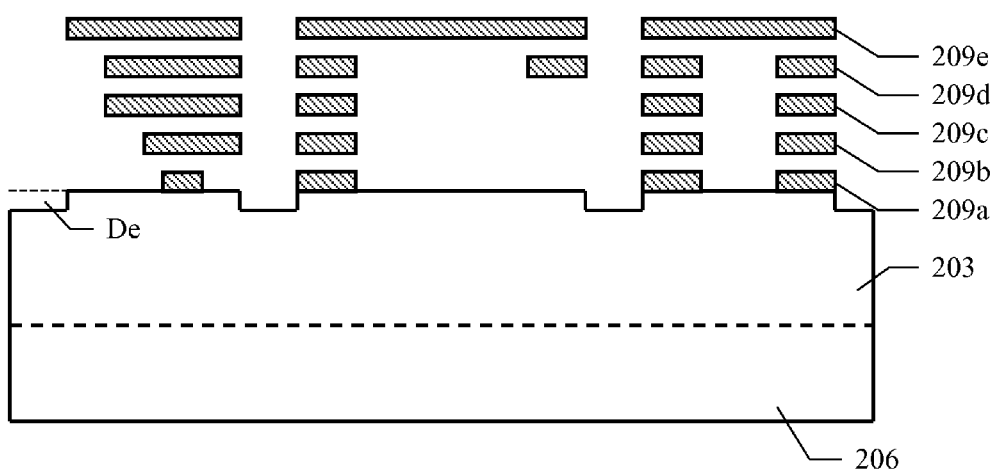

The process continues to FIG. 2B, wherein the porous silicon layer 203 is etched as above through the masks 209a-209e (i.e., through the uppermost mask 209e covering all the lower masks 209a-209d). The etching is performed for a corresponding partial thickness De (lower than the initial thickness $D_{PS}$ of the porous silicon layer 203).

Figure 2C:
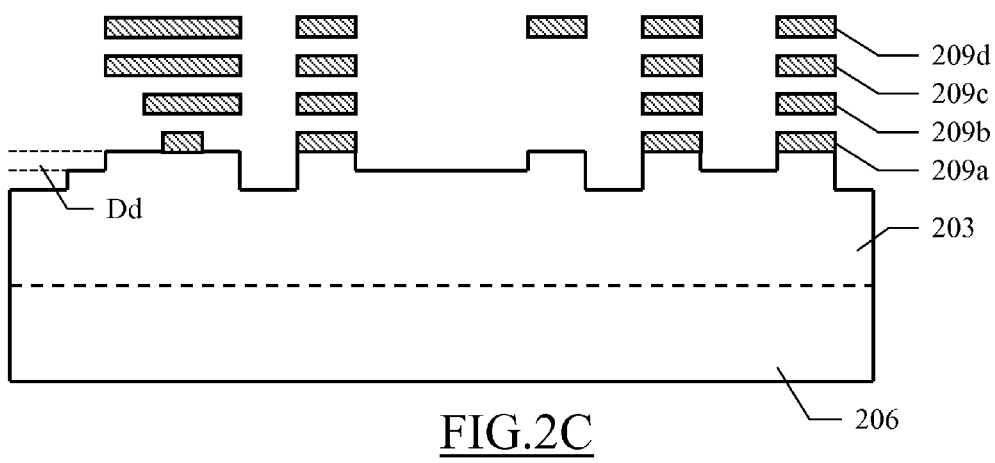

Moving to FIG. 2C, the uppermost mask (209e in FIG. 2B) is removed; for example, this result may be achieved with a wet etching process in a solution of 10% $K_3Fe(CN_6)$, which does not affect the lower masks 209a-209d. The porous silicon layer 203 is likewise etched through the masks 209a-209d (i.e., through the uppermost mask 209d) for a corresponding partial thickness Dd.

Figure 2D:
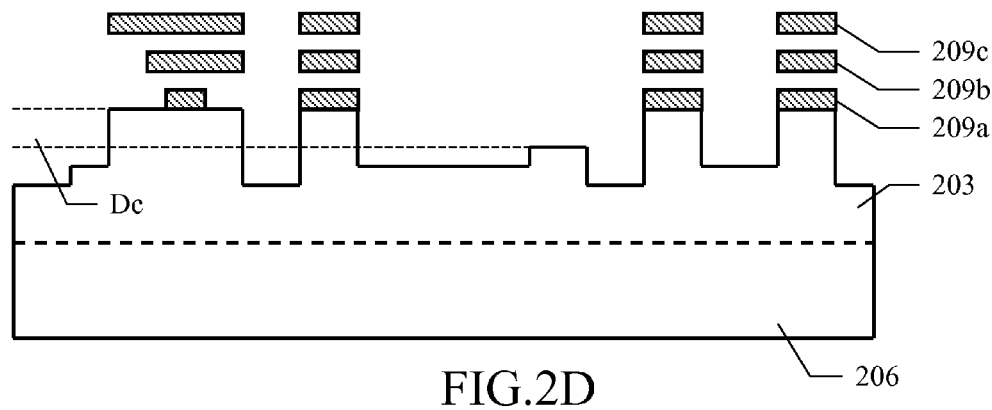

With reference now to FIG. 2D, the uppermost mask (209d in FIG. 2C) is removed; for example, this result may be achieved with a wet etching process in a solution of $FeCl_3$, which does not affect the lower masks 209a-209c. The porous silicon layer 203 is likewise etched through the masks 209a-209c (i.e., through the uppermost mask 209c) for a corresponding partial thickness Dc.

Figure 2E:
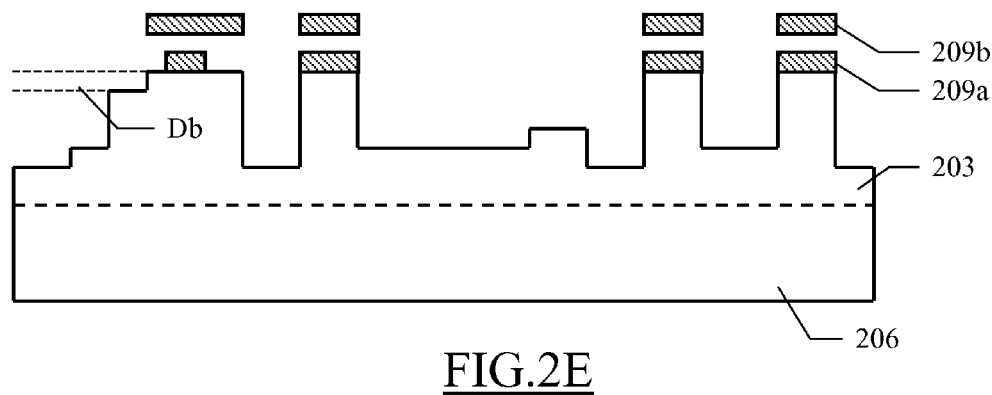

The process continues to FIG. 2E, wherein the uppermost mask (209c in FIG. 2D) is removed; for example, this result may be achieved with a wet etching process in a solution of $H_2SO_4$, which does not affect the lower masks 209a-209b. The porous silicon layer 203 is likewise etched through the masks 209a-209b (i.e., through the uppermost mask 209b) for a corresponding partial thickness Db.

Figure 2F:
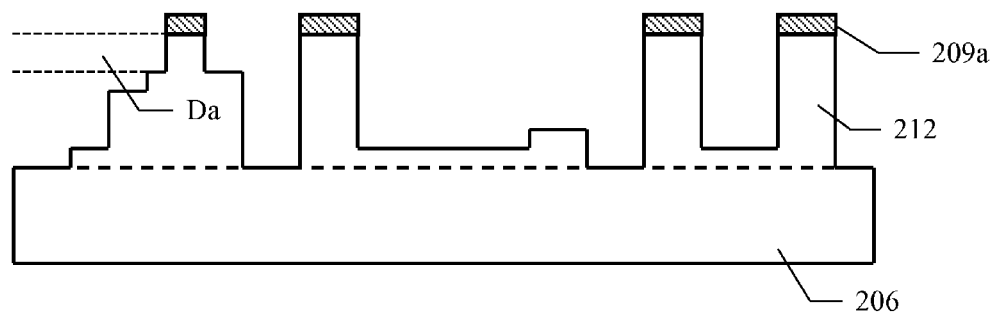

At the end, as shown in FIG. 2F, the uppermost mask (209b in FIG. 2D) is removed; for example, this result may be achieved with a wet etching process in a solution of $I_2$:KI:$H_2O$=1:2:10, which does not affect the lower mask 209a. The porous silicon layer 203 is likewise etched through the remaining mask 209a for a corresponding partial thickness Da. As a result, there are obtained projecting microelements 212 (of porous silicon) corresponding to the desired functional micro elements.

Figure 2G:
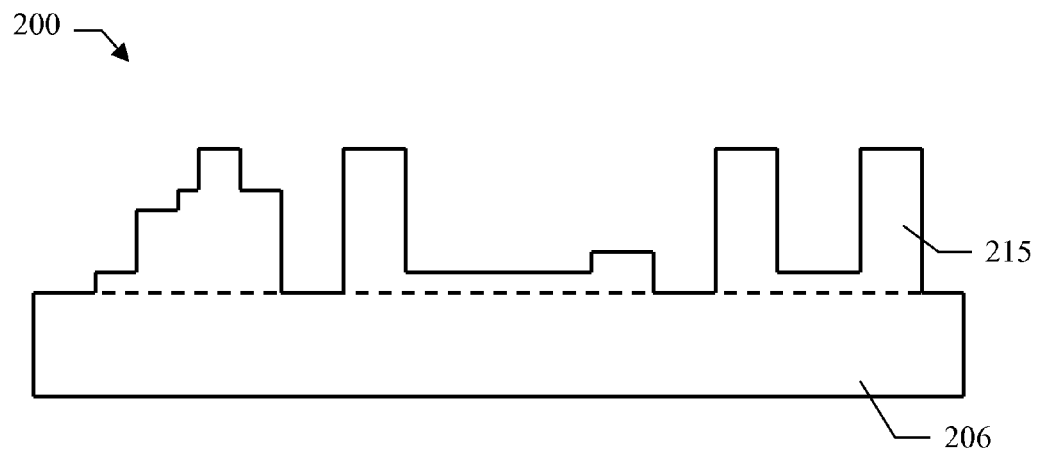

Moving to FIG. 2G, the last mask (209a in FIG. 2F) is removed—for example, with a wet etching process in a solution of HCl:$HNO_3$=3:1. The projecting microelements (212 in FIG. 2F) are then treated as above so as to obtain corresponding functional microelements 215 of porous metal or of porous ceramics. This provides the desired (conductive or insulating) microstructure 200.

This embodiment allows obtaining 3-D functional microelements 215 with any kind of shapes.

Some examples of application of the (conductive or insulating) microstructure being obtained as pointed out above are now described in detail.

For example, FIGS. 3A-3D show the additional phases of a production process for making an interconnection structure (denoted in FIG. 3D with the reference 300) according to an embodiment.

Figure 3A:
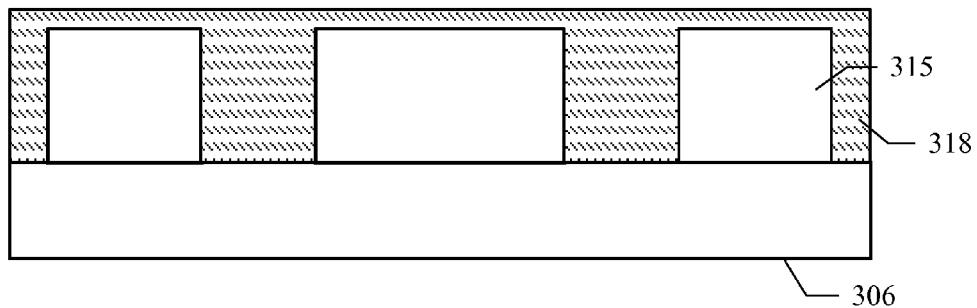
FIGS. 3A-3D show the additional phases of a production process for making an interconnection structure according to an embodiment, FIGS. 3A'-3D' show the additional phases of a production process for making the same interconnection structure according to another embodiment.

Starting from FIG. 3A, conductive microelements 315 are formed on a silicon substrate 306 as described above. A dielectric material is then applied on the silicon substrate 306 so as to embed the conductive microelements 315; the dielectric material may be any thermoplastic resin (such as nylon or liquid crystal polymer), thermosetting resin, ceramics precursor, and the like. The dielectric material can be applied by any suitable technique like casting, injection molding, dispensing, stencil printing, lamination, and the like. The dielectric material is then treated so as to obtain a corresponding dielectric layer 318 that embeds the conductive microelements 315 (so as to define an insulating base and vias, respectively, of the interconnection structure). For example, the dielectric material may be subjected to a curing, sintering and/or pyrolisis process; in this respect, it should be noted that the open structure of the conductive microelements 315 (which project from the silicon substrate 309 freely) strongly facilitates this operation. According to the dielectric material that was applied on the silicon substrate 306, the dielectric layer 318 may be either elastic or rigid.

Figure 3B:
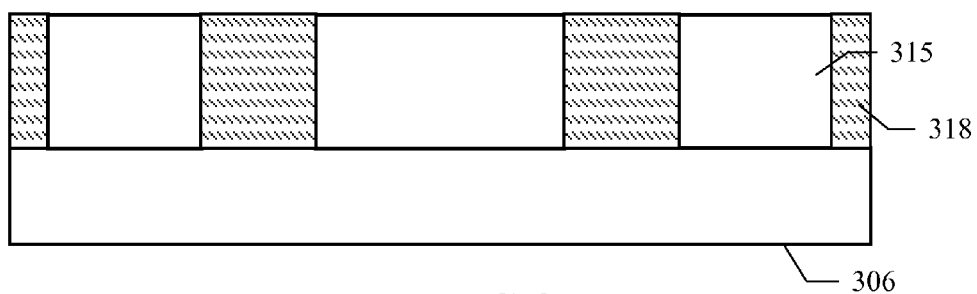

The process continues to FIG. 3B, wherein the dielectric layer 318 is planarized at the level of the conductive elements 315 (for example, with a grinding, polishing or lapping process).

Figure 3C:
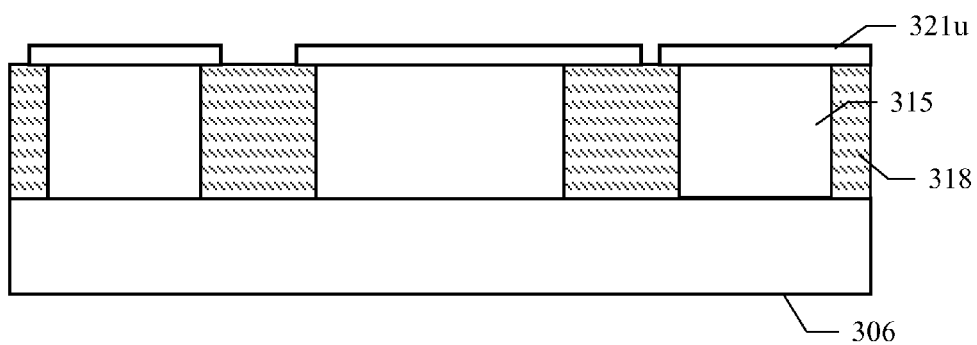

With reference now to FIG. 3C, contacts 321$u$ are formed on an upper surface of the dielectric layer 318. For example, the contacts 321$u$ (made of metal) consist of bonding pads and routing tracks, which are connected to the conductive microelements 315; for example, this result may be achieved with a thin and/or thick film process.

Figure 3D:
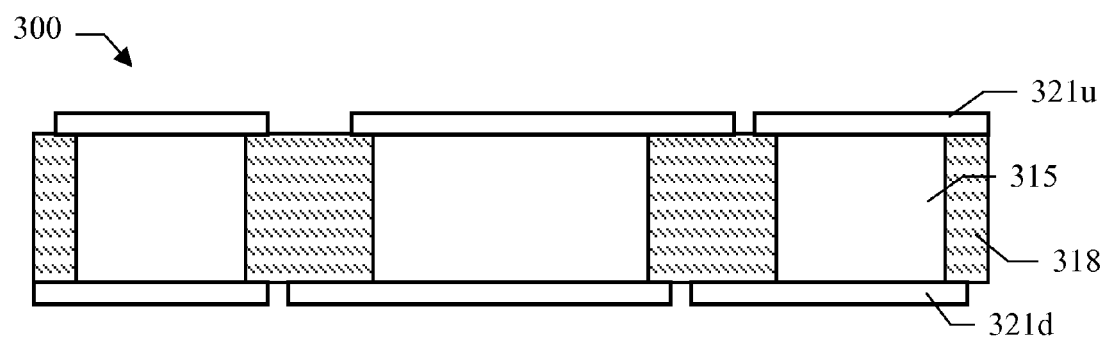
Figure 3A:
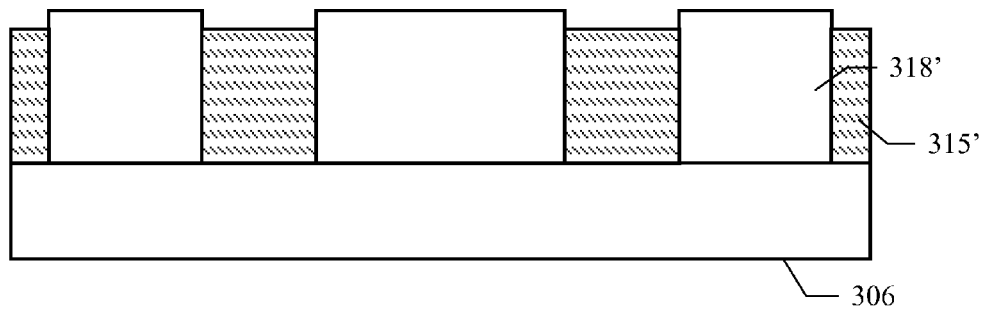
Figure 3B:
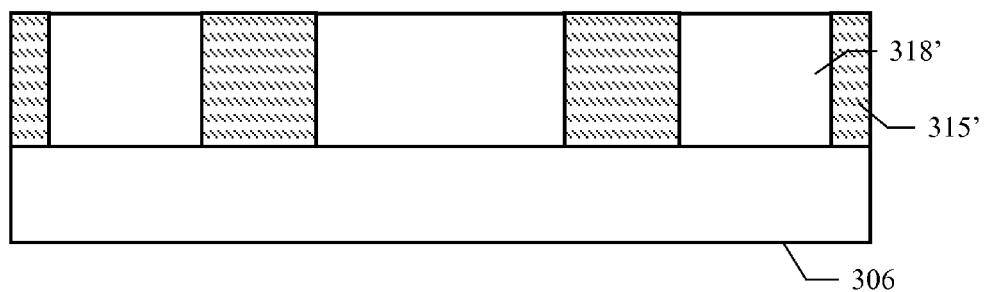
Figure 3C:
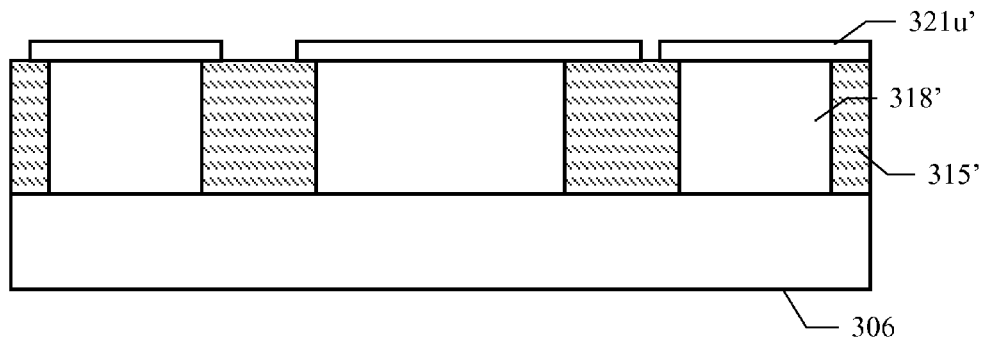
Figure 3D:
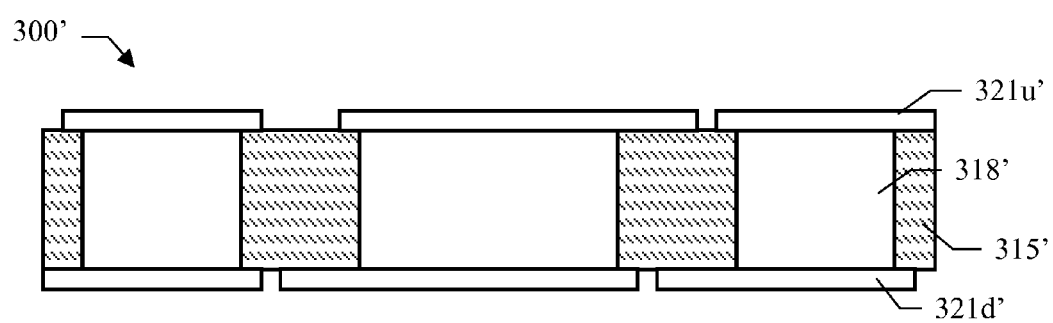

Moving to FIG. 3D, the silicon substrate (306 in FIG. 3C) is removed (for example, with a grinding and/or XeF$_2$ vapor etching process). Further contact elements 321$d$ are likewise formed on a lower surface of the dielectric layer 318 (as above, with a thin and/or thick film process providing bonding pads and routing tracks connected to the conductive microelements 315).

The proposed solution allows achieving a very high contact density (for example, of the order of 200 k-400 k contacts/cm$^2$); at the same time, the porous structure of the conductive microelements 315 provides a very high adhesion with the dielectric layer 318, thanks to the penetration of the dielectric material into the porous metal.

The same process described above (without the steps of forming the upper and lower contacts) may also be used to make a magneto-dielectric structure. For this purpose, the conductive microelements are of a porous magnetic metal (for example, Ni or Fe), which has a relative magnetic permeability $\mu_r$ far higher than 1. At the same time, the dielectric layer has a relative dielectric permittivity $\in_r$ far higher than 1; for example, this result may be achieved by filling the corresponding dielectric material with nano-particles of strontium titanate (with $\in_r$=310). The structure so obtained (after removing the silicon substrate) behaves as a magneto-dielectric material—which is seen as a uniform material (with high relative magnetic permeability $\mu_r$ and high relative dielectric permittivity $\in_r$) by any electromagnetic (EM) wave propagating across it. For example, this magneto-dielectric material may be used to make EM antennas with reduced size.

Similar considerations apply, with reference to FIGS. 3A'-3D', in the case of a production process for making an interconnection structure (denoted in FIG. 3D' with the reference 300') being based on insulating microelements.

Starting from FIG. 3A', insulating microelements 315' are formed on a silicon substrate 306 as described above. A conductive material (being possible magnetic) is then applied on the silicon substrate 306 so as to form conductive microelements 318' that are embedded among the insulating microelements 315' (so as to define an insulating base and vias, respectively, of the interconnection structure). For example, it is possible to apply a conductive paste (made of Ag, such as the paste being produced with the trade name PV135 by DuPont, or made of Cu, Al, Pt, Ag alloys, and the like) by means of a stencil printing process, and then subjecting the structure to a firing process in order to obtain conductive microelements 318' of compact metal. Alternatively, a Metal Injection Molding (MIM) technique may be used to obtain conductive microelements 318' (for example, of steel or magnetic metals) with density up to 98%. Another alternative for obtaining the conductive microelements 318' is to use a chemical deposition process, or a thin film deposition process of a conductive material followed by a galvanic process.

The process continues to FIG. 3B', wherein the conductive microelements 318' are planarized at the level of the insulating microelements 315' (for example, with a grinding, polishing or lapping process).

As above, contacts 321$u$' are formed on an upper surface of the insulating microelements 315' (FIG. 3C'); the silicon substrate is then removed, and further contacts 321$d$' are formed on a lower surface of the insulating microelements 315' (FIG. 3D').

Figure 4A:
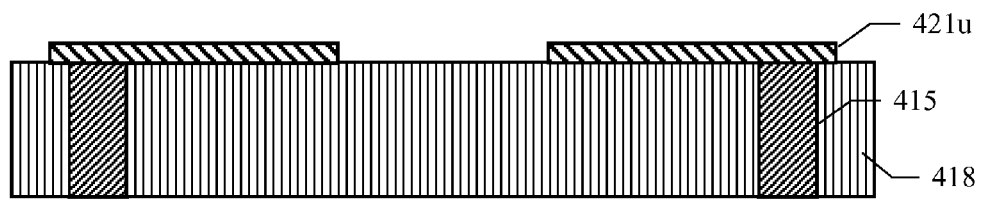
FIGS. 4A-4C show the additional phases of a production process for making a packaged electronic device according to an embodiment, FIGS. 4A'-4C' show the additional phases of a production process for making the same packaged electronic device according to another embodiment.
Figure 4B:
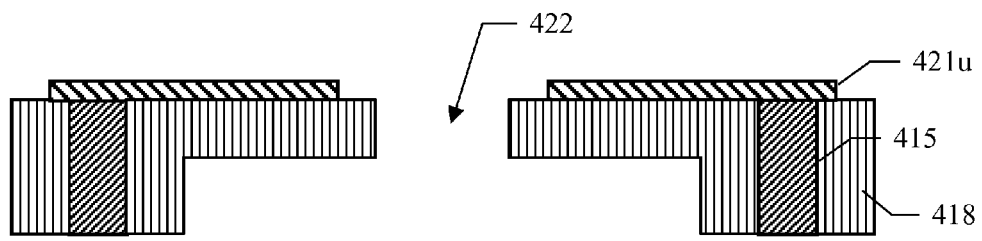
Figure 4C:
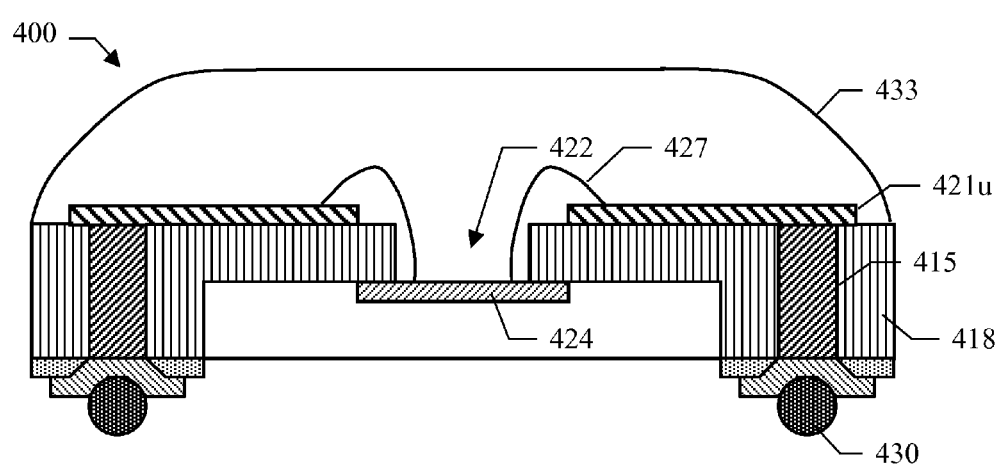
Figure 4A:
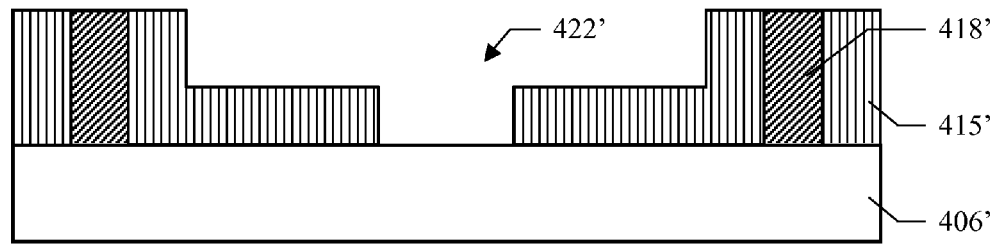
Figure 4B:
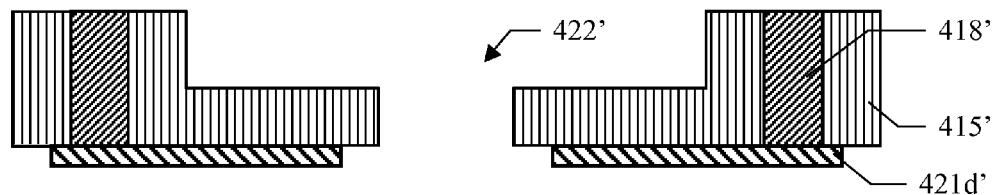
Figure 4C:
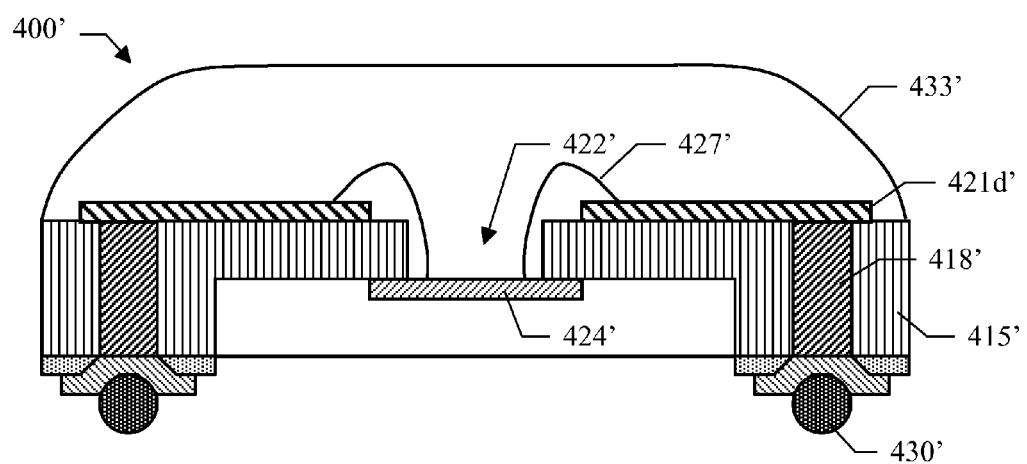

With reference now to FIGS. 4A-4C, there are shown the additional phases of a production process for making a packaged electronic device (denoted in FIG. 4C with the reference 400) according to an embodiment.

Starting from FIG. 4A, a circuitized substrate made of a (rigid) interconnection structure—with vias 415 crossing an insulating base 418 having upper contacts 421$u$—is obtained as described in FIGS. 3A-3D.

Passing to FIG. 4B, a through hole 422 with a lower spot-facing is formed through the dielectric layer 418 (for example, by a hot pressing process when it is of thermoplastic material).

As shown in FIG. 4C, a chip of semiconductor material 424 (integrating a corresponding circuit) is mounted within the spot-facing of the hole 422, so as to expose corresponding terminals (not shown in the figure) through the hole 422. The terminals of the chip 424 are bonded through wires 427 to corresponding pads of the contacts 421$u$; routing tracks of the contacts 421$u$ then connect these pads to corresponding vias 415. External terminals 430 of the electronic device 400—in the form of conductive balls with Under Bump Metallizations (UBMs)—are connected to the conductive microelements 415 on a lower surface of the insulating base 418. A protective cover 433 (for example, of plastic material) embeds the chip 424 and the wires 427, so as to leave exposed the external terminals 430 only.

The proposed solution allows obtained a circuitized substrate (with the desired high density, low resistance, and high heat dissipation), which exhibits a TCE very similar to the one of silicon; in this way, it is possible to avoid (or at least substantially reduce) any mechanical stress on the chip 424. For example, conductive elements of porous copper with a porosity $P_{PM}$ %=55% have a TCE=8.0 ppm/° C., that is far more similar to the TCE=2-5 ppm/° C. of the silicon than the TCE=17 ppm/° C. of compact copper is (at the same time providing a very low resistivity of 15.7 μΩcm).

FIGS. 4A'-4C' instead show the additional phases of an alternative production process for making the same packaged electronic device (denoted in FIG. 4C' with the reference 400') according to another embodiment.

Starting from FIG. 4A', in this case on a silicon substrate 406' there are made 3-D insulating microelements 415' (as described in FIGS. 2A-2G) and conductive microelements 418' (as described in FIGS. 3A'-3D'); particularly, the insulating microelements 415' are shaped so as to define a rigid insulating base (with a through hole 422' having an upper spot-facing) that it is crossed by vias being formed by the conductive microelements 418'.

Passing to FIG. 4B', the silicon substrate (406' in FIG. 4A') is removed, and contacts 421d' are formed on a lower surface of the insulating base 415' (connected to the vias 418').

As shown in FIG. 4C', the circuitized substrate thus obtained (being overturned) is used as above to make the desired electronic device 400' (likewise comprising a chip 424', wires 427', external terminals 430' and a protection cover 433').

Figure 5A:
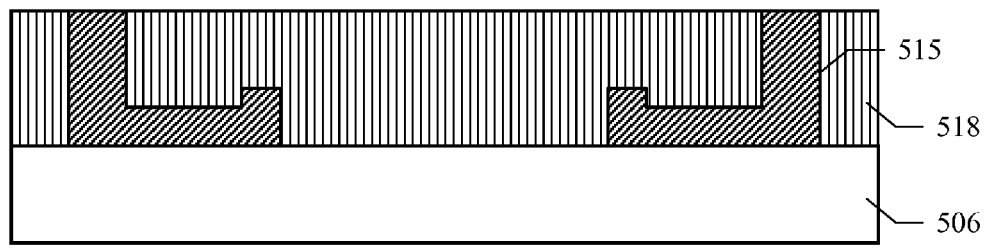
FIGS. 5A-5C show the additional phases of a production process for making a different packaged electronic device according to an embodiment, FIGS. 5A'-5C' show the additional phases of a production process for making the same different packaged electronic device according to another embodiment.
Figure 5B:
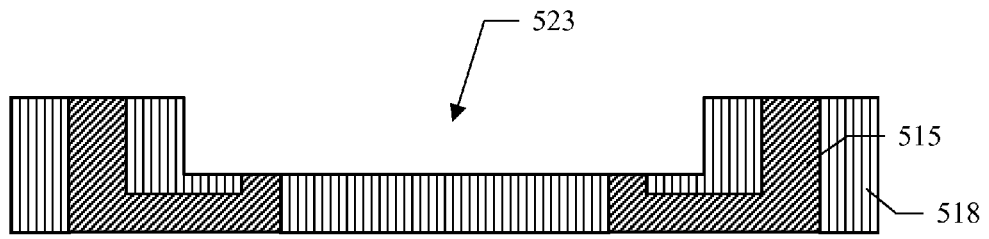
Figure 5C:
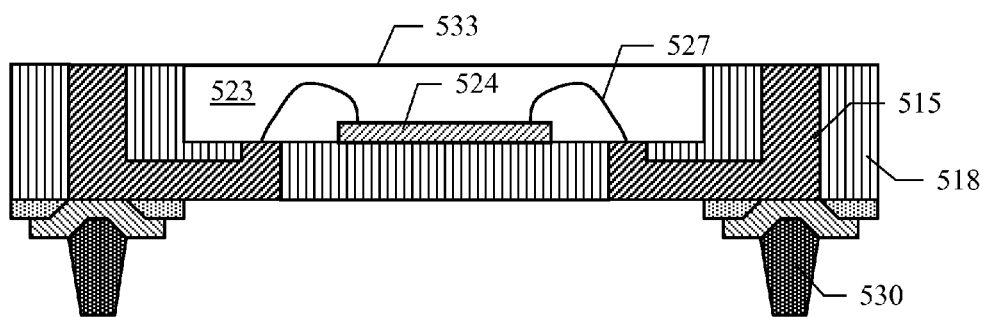
Figure 5A:
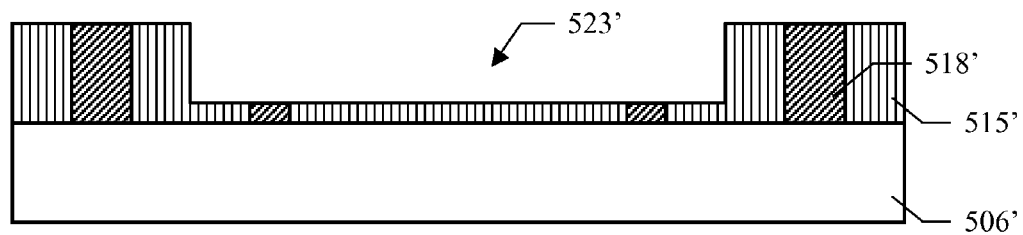
Figure 5B:
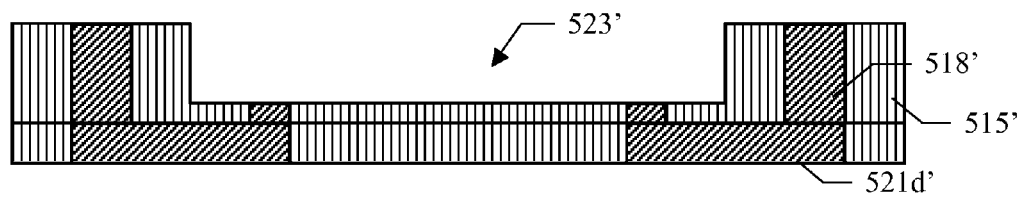
Figure 5C:
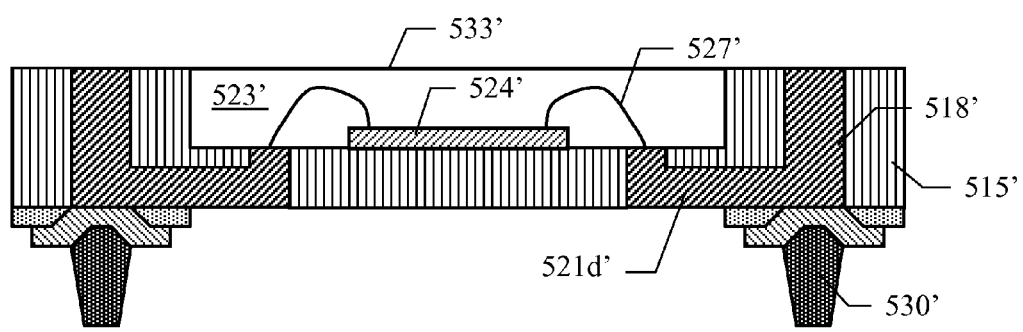

With reference to FIGS. 5A-5C, there are shown the additional phases of a production process for making a different packaged electronic device (denoted in FIG. 5C with the reference 500) according to an embodiment.

Starting from FIG. 5A, on a silicon substrate 506 there are made 3-D conductive microelements 515 (as described in FIGS. 2A-2G) embedded in a dielectric layer 518 (as described in FIGS. 3A-3D), which define vias crossing an insulating base, respectively.

Passing to FIG. 5B, an embossment 523 is formed on an upper surface of the insulating base 518 (for example, again by a hot pressing process when it is of thermoplastic material).

As shown in FIG. 5C, a chip of semiconductor material 524 is mounted within the embossment 523, and its terminals (not shown in the figure) are bonded through wires 527 to corresponding vias 515 (being exposed in the embossment 523); the vias 515 in turn connect the wires 527 to corresponding external terminals 530 of the electronic device 500—in the form of conductive pillars with UBMs—on a lower surface of the insulating base 518. A protective cover 533 embeds the chip 524 and the wires 527, so as to leave exposed the external terminals 530 only.

FIGS. 5A'-5C' instead show the additional phases of a production process for making the same packaged electronic device (denoted in FIG. 5C' with the reference 500') according to another embodiment.

Starting from FIG. 5A', in this case on a silicon substrate 506' there are made 3-D insulating microelements 515' (as described in FIGS. 2A-2G) and conductive microelements 518' (as described in FIGS. 3A'-3D'); particularly, the insulating microelements 515' are shaped so as to define a rigid insulating base (with an embossment 523') that it is crossed by vias being formed by the conductive microelements 518'.

Passing to FIG. 5B', the silicon substrate (506' in FIG. 5A') is removed; contacts 521d' (embedded in further dielectric material) are formed on a lower surface of the insulating base 515', so as to connect corresponding pairs of vias 518' to each other.

As shown in FIG. 5C', the circuitized substrate thus obtained is used as above to make the desired electronic device 500' (likewise comprising a chip 524', wires 527', external terminals 530' and a protection cover 533').

Figure 6:
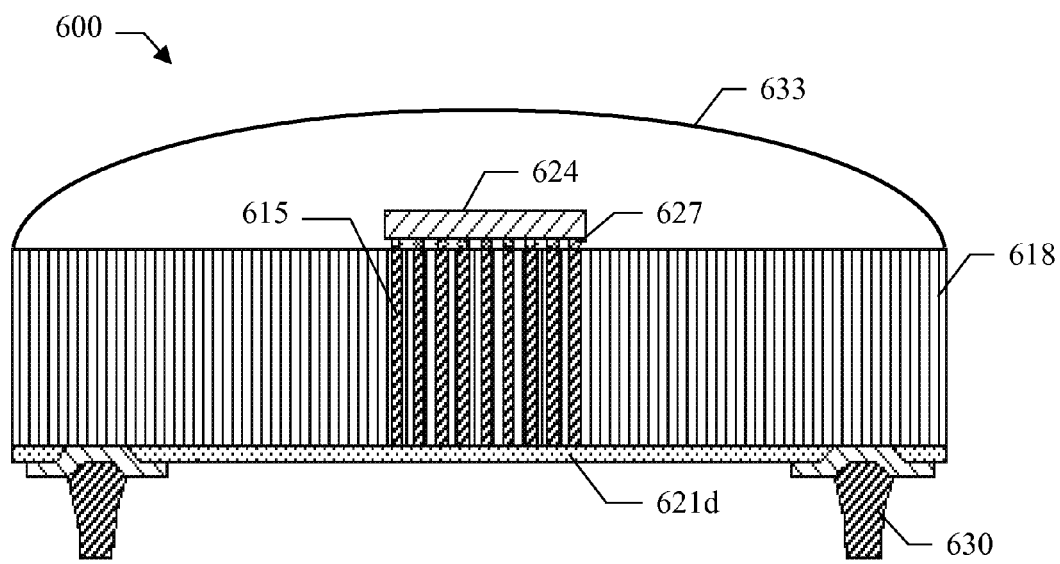
FIG. 6 is a further exemplary packaged electronic device that may be obtained with the solution according to an embodiment.

Considering now FIG. 6, there is shown a further exemplary packaged electronic devices 600 that may be obtained with the solution according to an embodiment. The electronic device 600 includes a circuitized substrate made of a (rigid) interconnection structure—with vias 615 crossing an insulating base 618 having lower contacts 621d—which is obtained as described above (with reference either to FIGS. 3A-3D or to FIGS. 3A'-3D'). A chip of semiconductor material 624 in mounted with a flip-chip technique above the insulating base 618; in this case, bonding balls 627 are used to connect terminals (not shown in the figure) of the chip 624—being overturned—to corresponding vias 615; the vias 615 connect the balls 627 to corresponding routing tracks of the contacts 621d. External terminals 630 of the electronic device 600—in the form of conductive pillars with UBMs—are in turn connected to the routing tracks of the contacts 621d. A protective cover 633, if necessary, embeds the chip 624 and the balls 627, so as to leave exposed the terminals 630 only.

Figure 7:
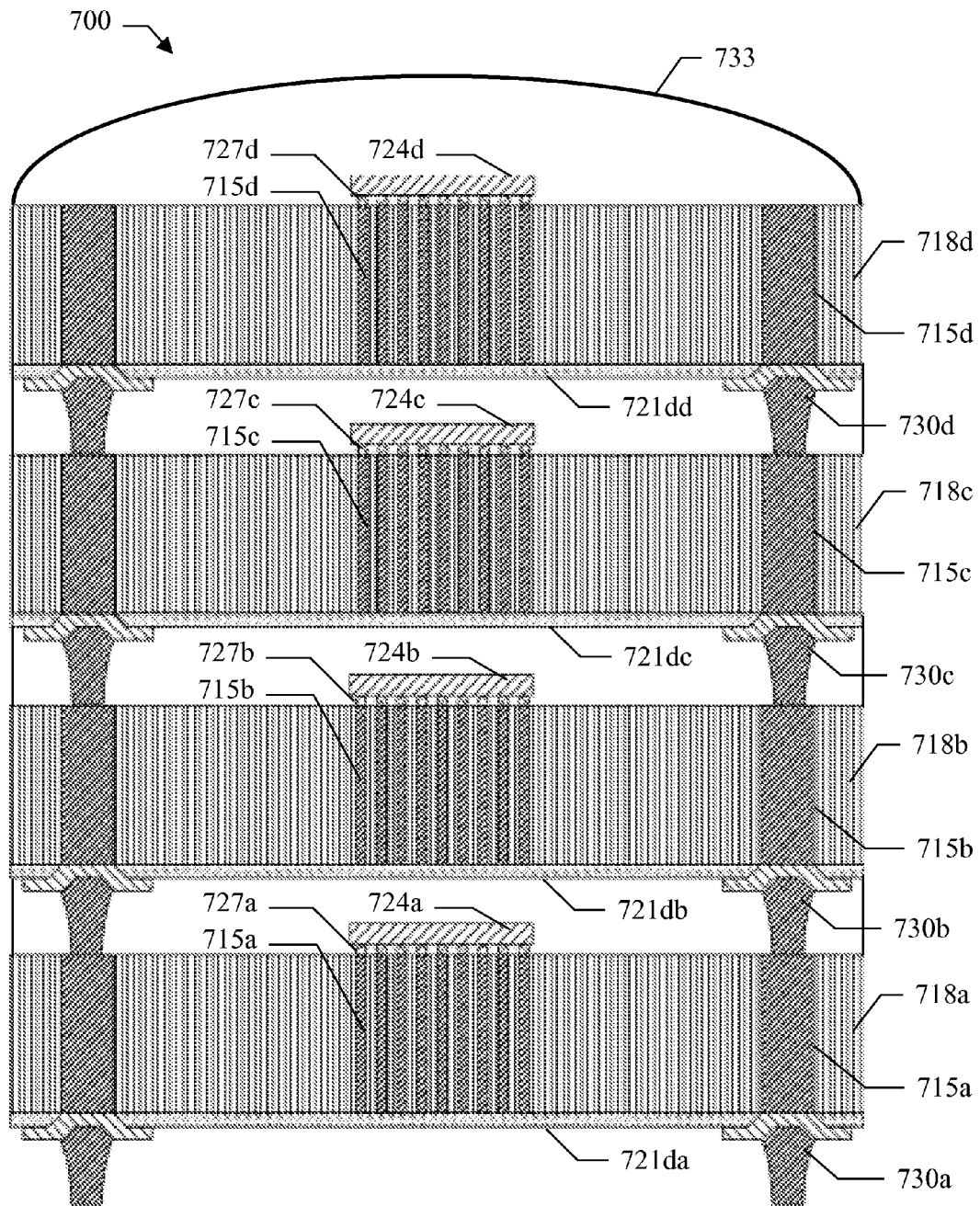
FIG. 7 is an exemplary package-on-package electronic device that may be obtained with the solution according to an embodiment.

As shown in FIG. 7, an exemplary package-on-package electronic device that may be obtained with the solution according to an embodiment o is denoted with the reference 700. The electronic device 700 includes a plurality of circuitized substrates (four in the example at issue), each one made of a (rigid) interconnection structure—with vias 715a-715d crossing an insulating base 718a-718d having lower contacts 721da-721dd and external terminals 730a-730d (in the form of conductive pillars which UBMs)—which is obtained as described above (FIG. 6). In this case as well, a chip of semiconductor material 724a-724d is mounted with a flip-chip technique above the insulating base 718a-718d, by means of bonding balls 727a-727d that are connected to corresponding (central) vias 715a-715d, routing tracks of the contacts 721da-721dd, and external terminals 730a-730d.

The circuitized substrates are stacked one on the other. Each circuitized substrate includes further (lateral) vias 715a-715d, which are connected to the external terminals 730b-730d of the circuitized substrates that are arranged above it; particularly, the lateral vias 715a-715d are directly corrected to the external terminals 730b-730d of an (upper) adjacent circuitized substrate, and they are corrected to the external terminals 730b-730d of the other (far way) circuitized substrates through the lateral vias 715a-715c of each interposed circuitized substrate. A lowest circuitized substrate in the stack includes further external terminals 730a, which are connected to the lateral vias 715a thereof (and then to the other chips 724b-724d). A protective cover embeds all the chips 724a-724d and the corresponding balls 727a-727d (either individually or together), so as to leave exposed all the external terminals 730a of the lowest circuitized substrate (for accessing both the respective chip 724a and the other chips 724b-724d).

Figure 8:
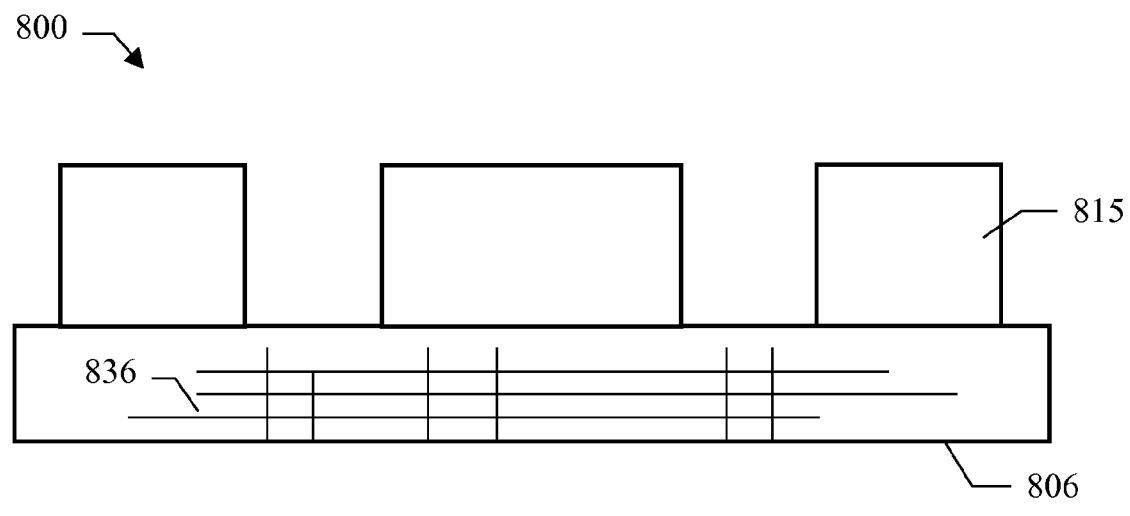
FIG. 8 is an exemplary power electronic device that may be obtained with the solution according to an embodiment.

Descending to FIG. 8, there is shown an exemplary power electronic device 800 that may be obtained with the solution according to an embodiment. The electronic device 800 is made by forming conductive microelements 815 on a silicon substrate 806 as described above. One or more power components 836 (such as IGBTs) are integrated in the silicon substrate 806 (from its lower surface). In this case, the conductive microelements 815 implement a heat sink for dissipating the heat that is generated by the power components 836 in operation.

The proposed solution allows making the heat sink 815 directly integral with the silicon substrate 806 (without requiring any additional bonding operation); this strongly simplifies the corresponding production process and improves the heat dissipation.

Figure 9A:
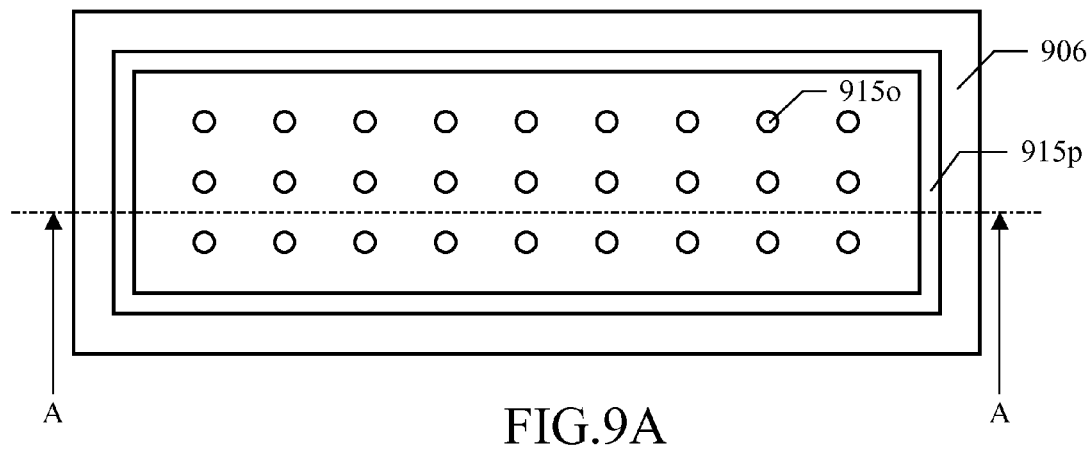
FIGS. 9A-9D show the additional phases of a production process for making a vacuum electronic device according to an embodiment.
Figure 9B:
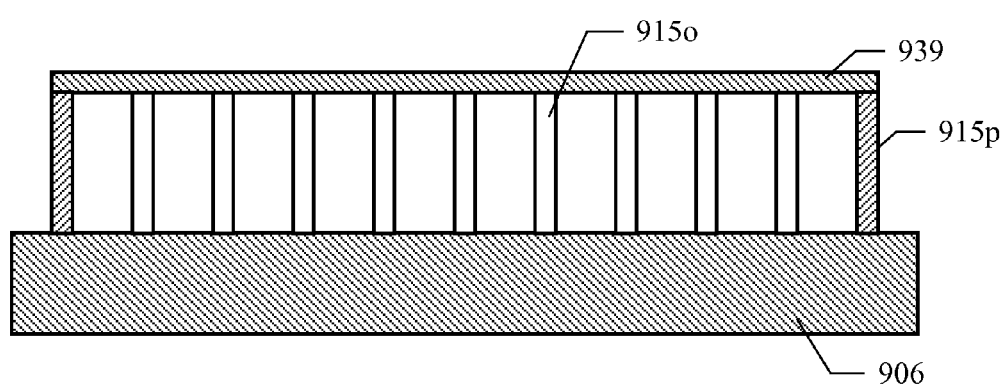
Figure 9C:
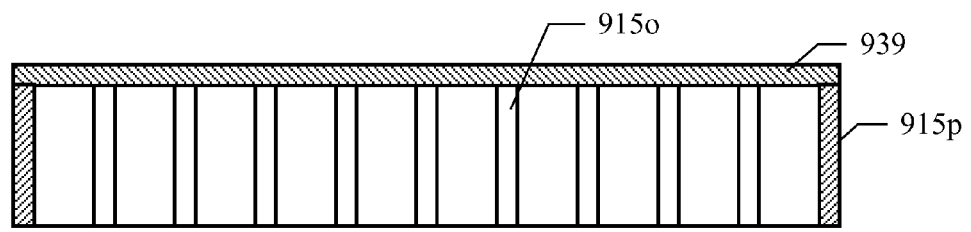
Figure 9D:
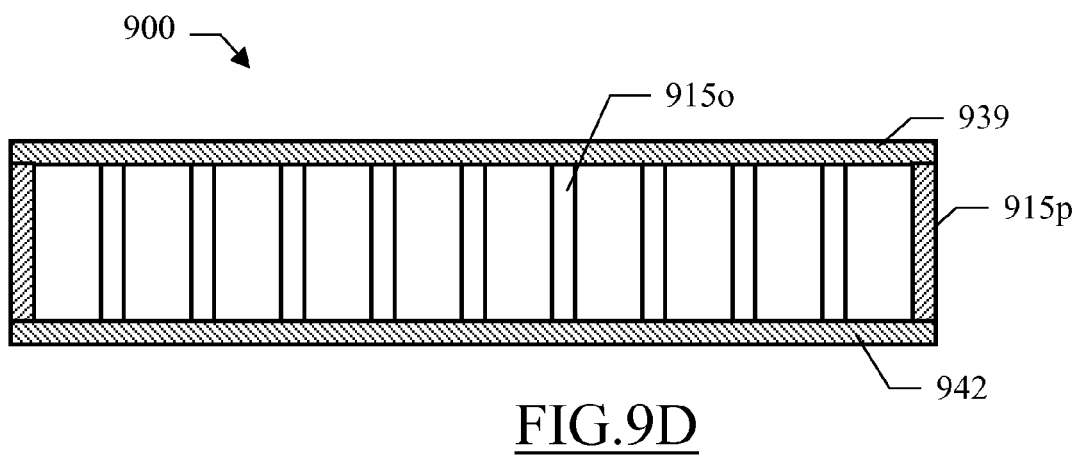

FIGS. 9A-9D instead show the additional phases of a production process for making a vacuum electronic device—denoted in FIG. 9D with the reference 900—according to an embodiment.

Starting from the plant view of FIG. 9A, conductive microelements are formed on a silicon substrate 906 as described above. Particularly, in this case a plurality of (operative) conductive microelements 915o (for example, in the form of pillars) are surrounded by a (protection) conductive microelement 915p (for example, in the form of a rectangular frame).

The process continues to FIG. 9B (showing a cross-section along the plan A-A of FIG. 9A), wherein a protection plate 939—for example, made of metal or with a metal/dielectric structure—is bonded on an upper free end of the conductive microelements 915o,915p (for example, with a soldering process).

Moving to FIG. 9C, the silicon substrate (906 in FIG. 9B) is removed as described above.

With reference now to FIG. 9D, a further protection plate 942—either equal to or different from the plate 939—is likewise bonded on a lower free end of the conductive microelements 915o,915p under substantially vacuum conditions (for example, with a pressure lower than $10^{-3}$ hPa that gives a mean free path for particles of more than 10 cm). As a result, the (protection) microelements 915p, plate 939 and plate 942 hermetically seal the conductive microelements 915o, so as to provide the desired electronic device 900. In this way, depending on the geometry of the conductive microelements 915o and/or 915p, it is possible to obtain a Field Emission Device, or FED (such as a triode, a penthode, etc.), a microwave microguide, a microwave linear-beam tube (e.g., a klystron or a travelling wave tube), or a microwave crossed-field tube (e.g., a magnetron oscillator, a forward wave crossed-field amplifier, etc.), especially for working frequencies in the TeraHz region.

At the end, FIGS. 10A-10F show the additional phases of a production process for making a micro-mechanism (denoted in FIG. 10F with the reference 1000) according to an embodiment.

Figure 10A:
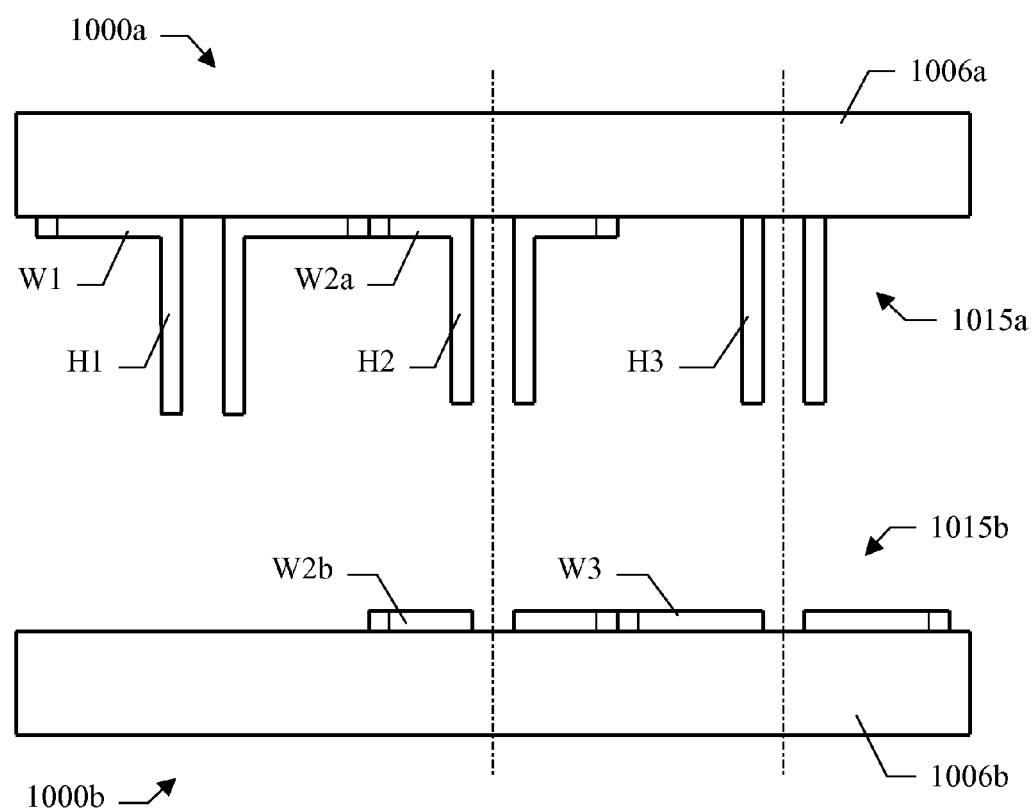
FIGS. 10A-10F show the additional phases of a production process for making a micro-mechanism according to an embodiment.

Starting from FIG. 10A, a microstructure 1000a is made (as described in FIGS. 2A-2G) so as to obtain (3-D) conductive or insulating functional microelements extending from a silicon substrate 1006a; particularly, the functional microelements 1015a define a cogwheel W1 with a respective hub H1, another cogwheel W2a with a respective hub H2, and a simple hub H3. Another microstructure 1000b is made (as described in FIGS. 1A-1D') so as to obtain conductive or insulating functional microelements extending from a silicon substrate 1006b; in this case, the functional microelements 1015b define a cogwheel W2b (for the hub H2) and another cogwheel W3 (for the hub H3). The microstructure 1000b is aligned to the microstructure 1000a (being overturned), so that the axes of the hub H2 and of the cogwheel W2b, and the axes of the hub H3 and of the cogwheel W3 (represented with dashed-dotted lines in the figure) coincide.

Figure 10B:
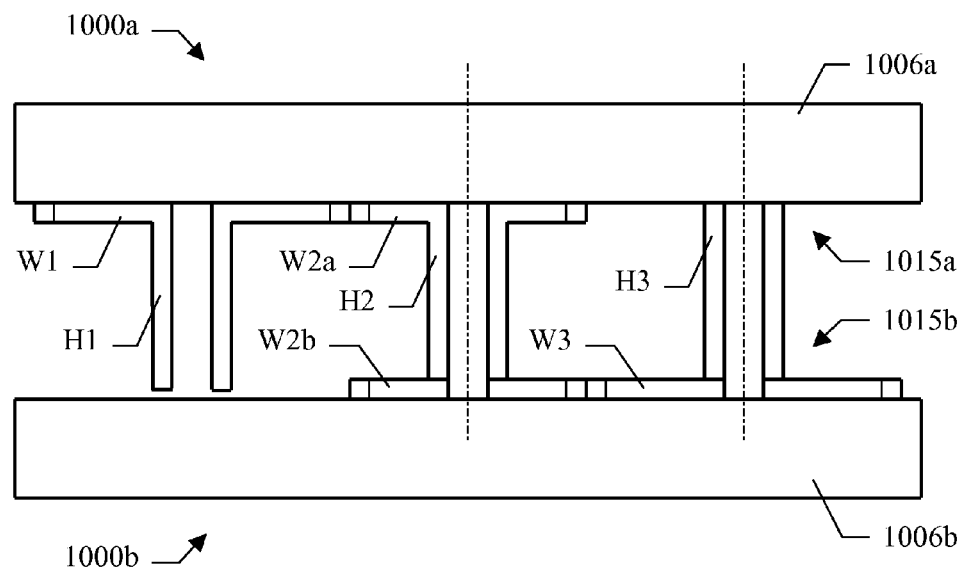

Passing to FIG. 10B, the two microstructures 1000a and 1000b are moved close to each other until the functional microelements 1015a contact the functional microelements 1015b where it is necessary. The functional microelements 1015a and 1015b being in contact are then bonded to each other—i.e., between the hub H2 and the cogwheel W2b, and between the hub H3 and the cogwheel W3. For example, in the case of conductive functional microelements this result may be obtained with a thermo-compression technique, whereas in the case of insulating functional microelements this result may be obtained with an anodic bonding technique.

It should be noted that where no bonding is required, the functional microelements of each microstructure are maintained spaced away from the functional microelements and the substrate of the other microstructure (for example, as in the case of the hub H1 that does not reach the substrate 1006b).

Figure 10C:
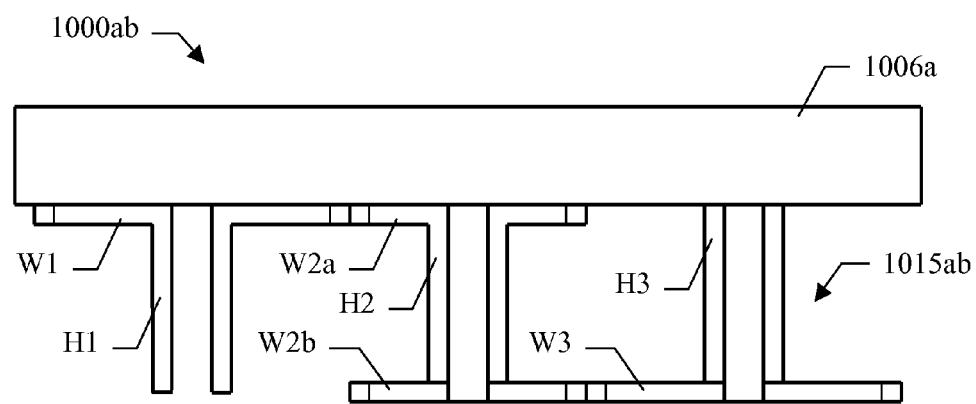

At this point, as shown in FIG. 10C, the lower silicon substrate (1006b in FIG. 10B) is removed. In this way, there is obtained a new microstructure (denoted with the reference 1000ab), which is formed by new functional microelements (denoted with the reference 1015ab)—resulting from the bonding of the previous functional microelements—which extend from the remaining silicon substrate 1006a.

The same bonding process described above may be repeated many times according to the desired shape of the functional microelements. Generally, the number of repetitions of the bonding process is only limited by the desired thickness and accuracy of the functional microelements. For example, standard bonding machines allow managing thickness up to 6-8 mm with an accuracy of 0.5 µm at 3σ; therefore, in this case it is possible to bond to each other up to 15-20 functional microelements having a thickness of 400 µm, with a total accuracy of 7.5-10 µm at 3σ.

Figure 10D:
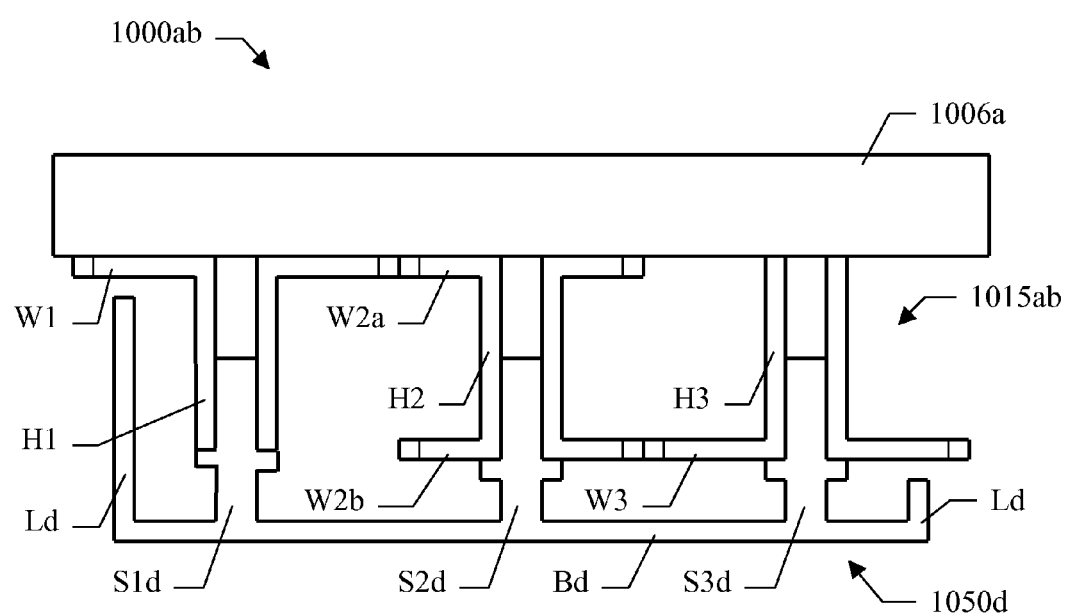

With reference now to FIG. 10D (assuming for the sake of simplicity that the bonding processes are completed with the microstructure 1000ab), the method continues by fitting a lower half-shell 1050d below the microstructure 1000ab. Particularly, the half-shell 1050d (for example, made of the same material as the functional microelements 1015ab) includes a base Bd having an extent slightly lower than the one of the functional microelements 1015ab. Three half-shafts S1d, S2d and S2d extend upwards from the base Bd; the half-shafts S1d, S2d and S3d are fitted in the hubs H1, H2 and H3, respectively, until the latest abut on corresponding stopping collars projecting laterally from the half-shafts S1d, S2d and S3d (with the half-shafts S1d, S2d and S3d that reach about the middle of the hubs H1, H2 and H3). A sidewall Ld extends perpendicularly upwards (from an edge of the base Bd) up to near the substrate 1006a; the sidewall Ld is provided with a depression that is crossed by an external portion of the cogwheel W3.

Figure 10E:
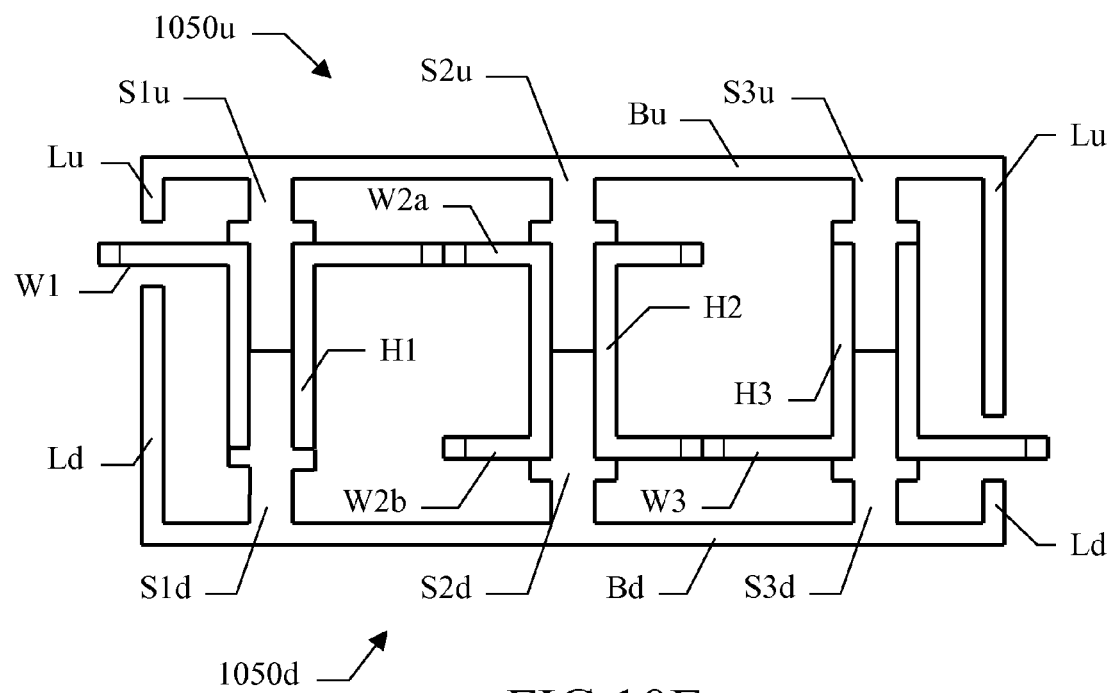

Passing to FIG. 10E, the remaining silicon substrate (1006b in FIG. 10D) is removed. An upper half-shell 1050u is now fitted above the functional microelements 1015ab (resting on the half-shell 1050d). Particularly, the half-shell 1050u (made of the same material as the half-shell 1050a) includes a similar base Bu. Three further half-shafts S1u, S2u and S3u extend downwards from the base Bu; the half-shafts S1u, S2u and S3u are likewise fitted in the hubs H1, H2 and H3, respectively, until they abut on the half-shafts S1d, S2d and S3d, respectively (leaving a small gap between the hubs H1, H2 and H3 and corresponding stopping collars projecting laterally from the half-shafts S1u, S2u and S3u). A sidewall Lu—provided with a depression that is crossed by an external portion of the cogwheel W1—extends perpendicularly downwards (from an edge of the base Bu). The sidewall Lu reaches the sidewall Ld, with the corresponding depressions that define two slits for the cogwheels W1 and W3, respectively. The half-shafts S1d, S2d, S3d and S1u, S2u, S3u and the sidewalls Ld and Lu being in contact are then bonded to each other as described above.

Figure 10F:
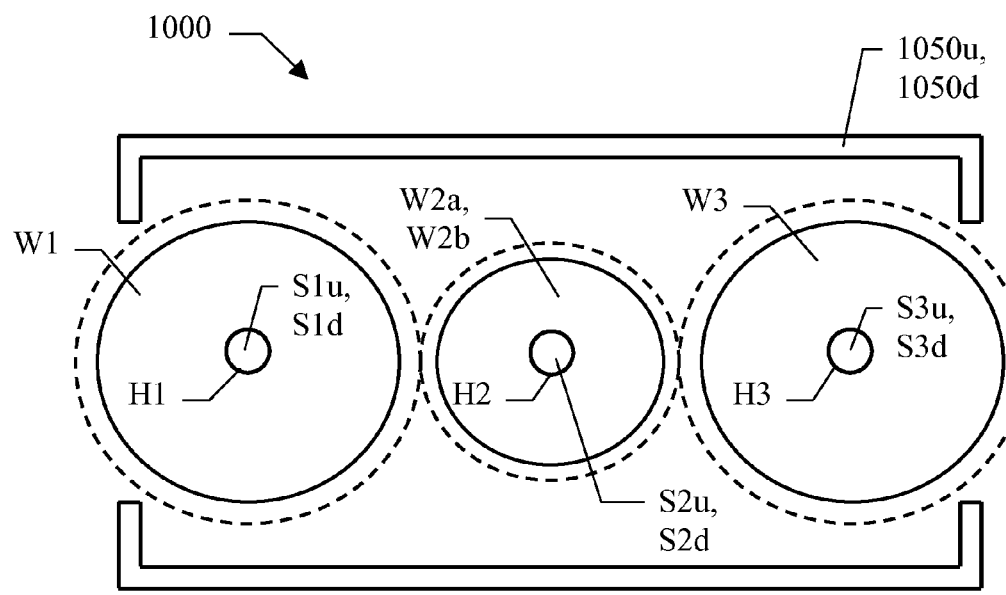

Making reference jointly to the front cross-section view of FIG. 10E and to the top cross-section view of FIG. 10F, in this way there is obtained a (coupling) micro-mechanism enclosed inside a shell being formed by the bonding of the half-shells 1050u and 1050d. The micro-mechanism is defined by the hubs H1, H2 and H3 that are mounted on shafts being formed by the bonding of the half-shafts S1$d$-S1$u$, S2$d$-S2$u$ and S3$d$-S3$u$, respectively (hold between the corresponding stopping collars). Particularly, the cogwheel W3 (projecting from the slit on the right of the shell 1050$u$, 1050$d$) is coupled with the cogwheel W2$b$; the cogwheel W2$a$—integral with the cogwheel W2$b$—is in turn coupled with the cogwheel W1 (projecting form the slit on the left of the shell 1050$u$,1050$d$).

The proposed solution allows making whatever micromechanism with a very high accuracy; moreover, it is possible to control several mechanical characteristics thereof (such as weight and stiffness) at will. For example, this allows making hinges, joints, pliers, medical instruments, mechanical watches, and so on.

Naturally, in order to satisfy local and specific requirements, a person skilled in the art may apply to the solution described above many logical and/or physical modifications and alterations. More specifically, although this solution has been described with a certain degree of particularity with reference to preferred embodiment(s) thereof, it should be understood that various omissions, substitutions and changes in the form and details as well as other embodiments are possible. Particularly, the same solution may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

Particularly, the proposed solution lends itself to be implemented with an equivalent method (by using similar steps, removing some steps being non-essential, or adding further optional steps); moreover, the steps may be performed in a different order, concurrently or in an interleaved way (at least in part).

Similar considerations apply if the starting material is any other silicon substrate (even made of polysilicon). Moreover, the porous silicon layer may have a different thickness and/or porosity. The above-described etching processes are merely illustrative—with equivalent results that may be achieved by using plasma etching processes with different parameters (such as gas, RF power and/or pressure), or more generally with whatever dry etching process (such as sputtering, ion milling, or laser ablation). Moreover, the functional elements (all of them conductive, all of them insulating, or in part conductive and in part insulating) may have any other shape and/or structure (being porous, compact, or in combination thereof); in any case, it is also possible to have compound functional microelements (with an external portion of porous metal or ceramics and an internal core of porous silicon).

Naturally, equivalent processes may be used to convert the porous silicon into whatever metal, or more generally conductive material.

Likewise, equivalent processes may be used to convert the porous silicon into whatever (porous and/or compact) ceramics. Particularly, the thermal process being used to convert the porous silicon into porous ceramics may have different parameters (for example, atmosphere, regime and/or length).

Similar considerations apply to the thermal processes for converting the porous silicon into compact ceramics; in any case, this operation may affect an external layer only of the porous ceramics, or it may be omitted at all.

Nothing prevents using other gases or vapors in the thermal processes.

Alternatively, the structure may be immersed into solutions containing nano-particles of any other type before the thermal process, for a time sufficient to have the nano-particles penetrate either completely or only partially into the porous silicon (even if this step is merely optional).

Analogous considerations apply to the treatment of the projecting microelements with any other material, so as to obtain two or more layers of porous ceramics each based on one or more different elements (for example, carbon inside and oxygen outside); moreover, nothing prevents using other materials (even not of the polymeric type) and treatment times. In any case, this treatment may be combined with the preceding immersion into the solution containing nano-particles, or it may be omitted at all.

Alternatively, it is possible to change the current density over time with a different law (e.g., parabolic, hyperbolic or step decrease, multiple constant pulses followed by any decrease, and the like). More generally, the desired structure of the porous silicon layer may be obtained with any other regime of the anodic process, even by acting on additional and/or different parameter(s) thereof (such as the electrolyte concentration). In any case, the porosity may be modulated in another way (for example, either decreasing or increasing towards the silicon substrate, or for different zones).

For example, it is possible to have three or more layers of porous silicon with different porosity; vice-versa, the porous silicon may be completely uniform.

Any other process may be used to cover the conductive microelements and/or the insulating microelements and the free surface of the silicon substrate (or parts thereof) with whatever material—even if this step is merely optional.

The proposed solution lends itself to be implemented with any number of masks to obtain any kind of 3-D microelements; likewise, the masks may have different shapes and/or they may be of different materials.

Nothing prevents making the magneto-dielectric material with any other magnetic and/or dielectric material; moreover, the magnetic material may either project from the dielectric material or it may be completely embedded into it. Naturally, the mentioned applications of the magneto-dielectric material are merely illustrative, and they must not be interpreted in a limitative manner.

With reference now to the application of the above-described solution in the field of interconnection structures, any other technique may be used to apply the dielectric material (to embed the conductive microelements) or the conductive material (to be embedded among the insulating microelements), so as to obtain the desired vias crossing the dielectric material or the insulating microelements, respectively; moreover, this dielectric or conductive material may be of different type, and it may be have any other extent. As above, the silicon substrate may be removed with any other technique. More generally, it is possible to make the interconnection structure with contacts of whatever type (even with a multi-layer structure) on both its opposed surfaces, only on one surface, or even without them (for example, for use of the interconnection structure as a resilient interposer).

The above-described packaged electronic devices are not exhaustive, with the proposed circuitized substrate that may be used for mounting one or more chips that are connected in whatever manner to any kind of external terminals of the electronic device—either of the Single Chip Module (SCM) or Multi Chip Module (MCM) type.

Likewise, the package-to-package electronic device may include any number and/or type of components (even different to each other), which are connected in any other way through the proposed substrates (for example, via conductive balls).

Similar considerations apply if any other components (such as power MOSs or CMOSs) are integrated in the silicon substrate with the proposed heat sink.

Moreover, there is not excluded the possibility of forming the vacuum electronic devices with different protection plates, or any equivalent element (for example, made of metal/dielectric), or of surrounding the (operative) conductive microelements with any other protection element (for example, made of porous silicon); moreover, the vacuum electronic devices may be of any other shape and/or type (even obtained under different vacuum conditions).

Similar considerations apply to micro-mechanism of other type (being obtained with whatever number of bonding processes, or even directly from the functional microelements of a stand-alone microstructure); moreover, the bonding processes may be of different type (for example, melting, sticking, soldering, and the like). In any case, the same technique may be applied to make micro-motors, micro-reactors, and so on.

In any case, it is emphasized that the above-described examples of application of the proposed solution are not exhaustive; more generally, the same technique may be used to make any electronic and/or mechanical microstructures—such as passive components (for example, inductors, capacitors, transformers and baluns), reading and/or writing heads for magnetic hard-disks, bio-technology elements (such as biological filters), ceramics membranes for pressure sensors, medical releasing devices, and so on.

It should also be readily apparent that the design of the microstructures may be created in a programming language; moreover, if the designer does not fabricate the microstructures, the design may be transmitted by physical means to others. In any case, the resulting microstructures may be distributed by its manufacturer in raw wafer form, as bare dies, or in packages. Moreover, the proposed microstructures may be integrated with other components, or they may be mounted in intermediate products (such as mother boards). In any case, the microstructures are suitable to be used in complex systems (such as computers).

The invention claimed is:

1. A method for making a microstructure, the method including the steps of:
   providing a silicon substrate, the silicon substrate having a main surface,
   forming a porous silicon layer extending into the silicon substrate from the main surface,
   after forming the porous silicon layer, etching the porous silicon layer selectively to obtain a set of projecting microelements of porous silicon, each projecting microelement projecting from a remaining portion of the silicon substrate thereby exposing a corresponding external surface, and
   treating the projecting microelements to obtain a set of corresponding conductive or insulating microelements, each conductive or insulating microelement being obtained by converting at least a prevalent portion of the porous silicon of the corresponding projecting element into porous metal or ceramics, respectively, the porous metal or ceramics replacing the porous silicon extending toward the projecting element from the external surface.

2. The method according to claim 1, wherein the step of treating the projecting microelements to obtain a set of corresponding conductive microelements includes:
   immersing the projecting microelements into a solution including at least one metal element.

3. The method according to claim 1, wherein the step of treating the projecting microelements to obtain a set of corresponding insulating microelements includes:
   subjecting the projecting microelements to a first thermal process at a first temperature to convert the at least a prevalent portion of the porous silicon into porous ceramics.

4. The method according to claim 3, wherein the step of treating the projecting microelements to obtain a set of corresponding insulating microelements further includes:
   subjecting the projecting microelements to a second thermal process at a second temperature, higher than the first temperature, to convert at least part of the porous ceramics into compact ceramics.

5. The method according to claim 3, wherein each thermal process is performed in an atmosphere including oxygen, carbon and/or nitrogen.

6. The method according to claim 3, wherein the step of treating the projecting microelements to obtain a set of corresponding insulating microelements further includes, before subjecting the projecting microelements to the first thermal process:
   immersing the projecting microelements into a solution including nano-particles to have the solution penetrate at least partly into the porous silicon, and
   evaporating the penetrated solution to leave at least part of the nano-particles of the penetrated solution inside the porous silicon.

7. The method according to claims 3, wherein the step of treating the projecting microelements to obtain a set of corresponding insulating microelements further includes, before subjecting the microelements to the first thermal process in an atmosphere including at least one first element:
   treating the porous silicon superficially with a material based on at least one second element to have the material penetrate into an outer layer of the at least a prevalent portion of the porous silicon without penetrating into a remaining inner layer thereof, the first thermal process converting the outer layer into porous ceramics being based on the at least one first element and the at least one second element, and the inner layer into porous ceramics based on the at least one first element.

8. The method according to claim 1, wherein the step of forming a porous silicon layer includes:
   subjecting the silicon substrate to at least one anodic process with a regime adapted to modulate a porosity of the porous silicon layer.

9. The method according to claim 8, wherein the step of subjecting the silicon substrate to at least one anodic process includes:
   subjecting the silicon substrate to a first anodic process with a first regime to obtain an external portion of the porous silicon layer with a first porosity, and
   subjecting the silicon substrate to a second anodic process with a second regime to obtain an internal portion of the porous silicon layer with a second porosity higher than the first porosity.

10. The method according to claim 1, further including the step of:
    covering each conductive microelement with a layer of compact metal and/or covering each insulating microelement and a free surface of the remaining portion of the silicon substrate from which the insulating microelements project with a conductive layer.

* * * * *